United States Patent [19]
Urabe et al.

[11] Patent Number: 5,760,629
[45] Date of Patent: Jun. 2, 1998

[54] DC OFFSET COMPENSATION DEVICE

[75] Inventors: Yoshio Urabe, Ibaraki; Hitoshi Takai, Toyono; Hidetoshi Yamasaki, Amagasaki; Akihiro Tatsuta, Kashiwara, all of Japan

[73] Assignee: Matsushita Electric Industrial Co., Ltd., Osaka-fu, Japan

[21] Appl. No.: 683,309

[22] Filed: Jul. 18, 1996

[51] Int. Cl.$^6$ ............................................. H03L 5/00
[52] U.S. Cl. .............................. 327/307; 327/362
[58] Field of Search .............................. 327/306, 307, 327/362, 551

[56] References Cited

U.S. PATENT DOCUMENTS

| | | | |
|---|---|---|---|
| 4,612,450 | 9/1986 | Gilz et al. | 327/307 |
| 5,182,476 | 1/1993 | Hanna et al. | 327/362 |
| 5,304,941 | 4/1994 | Tateishi | 327/307 |
| 5,539,779 | 7/1996 | Nagahori | 327/307 |

FOREIGN PATENT DOCUMENTS 62-53023  3/1987  Japan.
8-32383   2/1996  Japan.

*Primary Examiner*—Toan Tran
*Attorney, Agent, or Firm*—Wenderoth, Lind & Ponack, L.L.P.

[57] ABSTRACT

A level detector 2 detects variation of the amplitude of an input signal a to output a level signal b representing HIGH or LOW in order to define the head portion of the input circuit a. A time constant control signal 3 generates a time constant control signal c based on the level signal b to control a time constant of an estimator 4 so as to make the time constant small for a prescribed period from a time when the level signal b varies from HIGH to LOW. The estimator 4 estimates DC offset included in the input signal a with the a time constant variation according to the time constant control signal c to output an estimate d. A compensator 1 subtracts the estimate d from the input signal a to obtain a compensation output. Therefore, in the estimator 4, the speed of estimating the DC offset is different between a period corresponding to the head portion of the input signal a and other periods. Thus, a DC offset compensation device can be configured to be capable of fast DC offset compensation at the head portion of the input signal a and stable DC offset compensation at the other portions.

22 Claims, 18 Drawing Sheets

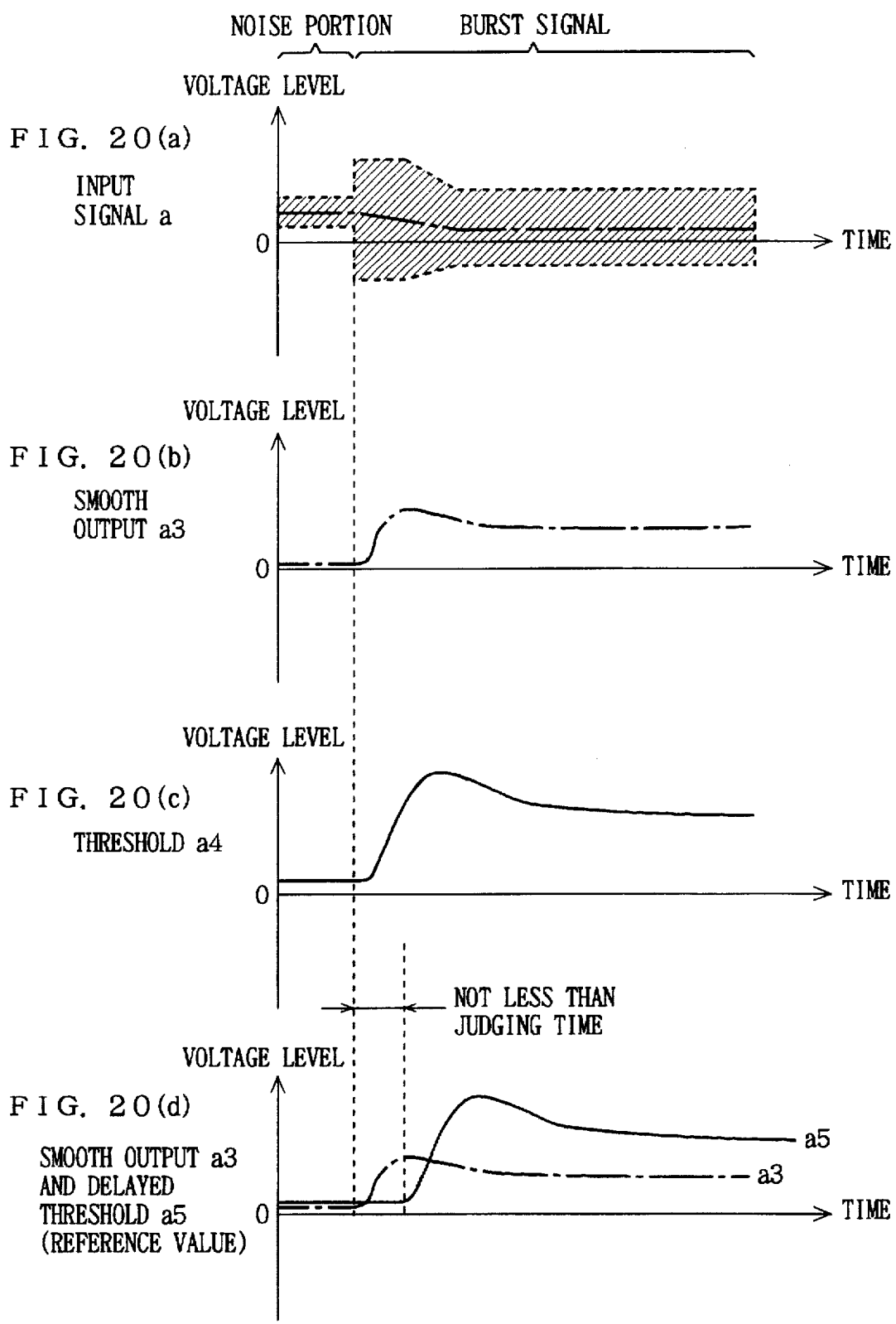

F I G. 2 1 PRIOR ART
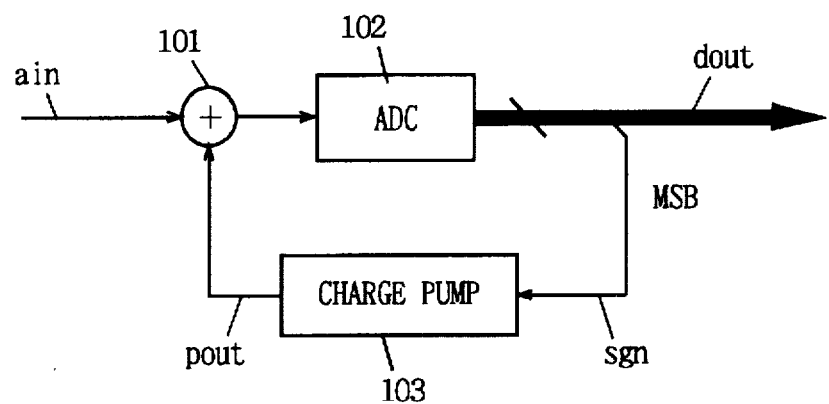

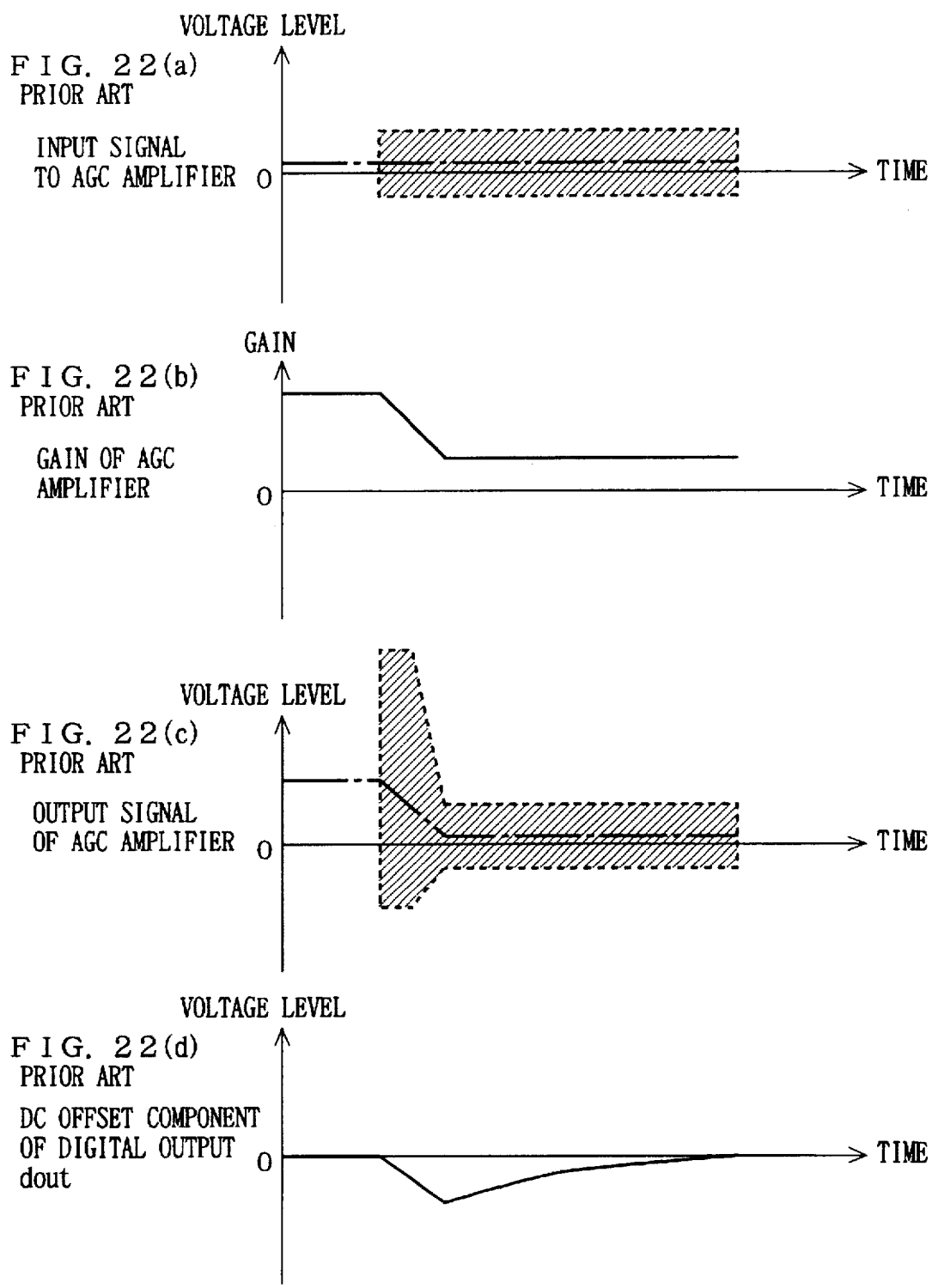

DC OFFSET COMPENSATION DEVICE

BACKGROUND OF THE INVENTION

1. Field of the Invention

This invention relates to DC offset compensation devices and more specifically to a DC offset compensation device automatically eliminating a DC offset component which is included in a received signal, a detected signal, etc., amplified by an automatic gain control function.

2. Description of the Background Art

When a signal with a low voltage level is received, a DC offset component caused by an amplifier or an AD converter becomes a big factor in interfering with a precise signal receiving. Therefore, it is important to eliminate the DC offset component of a received signal. A DC offset compensation device for eliminating the DC offset component of the received signal is thus installed in a receiver. A conventional DC offset compensation device is disclosed in Japanese Patent Laying-Open No. 62-53023, for example. The conventional DC offset compensation device is subsequently described while referring to the drawings.

FIG. 21 is a block diagram showing a structure of the conventional DC offset compensation device. In FIG. 21, the DC offset compensation device includes an adder 101, an A/D converter (ADC) 102 and a charge pump 103. An analog input signal ain, which is band-limited and whose average of amplitude distribution is 0 is inputted to the DC offset compensation device. The analog input signal ain is added to a correction signal pout at the adder 101, and is converted to a digital output dout at the A/D converter 102. The charge pump 103 inputs a most significant bit (MSB) sgn of the digital output dout and integrates sgn to obtain the correction signal pout. Since the digital output dout is represented by a complement on two, the MSB sgn designates a sign of the digital output dout. That is, the MSB sgn is 0 when the digital output dout is positive, and the MSB is 1 when the digital output dout is negative. Therefore, if the digital output dout is biased to the negative side on the average, the charge pump 103 integrates 1 to gradually increase the correction signal pout. In response, the voltage level of a signal outputted by the adder 101 moves to the positive side. Therefore, the digital output dout also gradually moves to the positive side to automatically correct bias of the digital output. The DC offset compensation device thus outputs the digital output dout without the DC offset component.

When the DC offset compensation device with the above structure is applied to a receiver having an automatic gain control (AGC) amplifier, however, the following problems will occur.

FIGS. 22(a) to 22(d) are diagrams for describing problems when the DC offset compensation device in FIG. 21 is applied to the receiver having the AGC amplifier. FIG. 22(a) schematically shows a waveform of a signal inputted to the AGC amplifier. FIG. 22(b) shows time variation of a gain of the AGC amplifier. FIG. 22(c) schematically shows a waveform of a signal outputted by the AGC amplifier. FIG. 22(d) shows time variation in a voltage level of the DC offset component included in the digital output dout when a signal outputted by the AGC amplifier (refer to FIG. 22(c)) is inputted to the conventional DC offset compensation device.

In FIG. 22(a), the input signal inputted to the AGC amplifier is a wide band signal which is band-limited and whose average of amplitude distribution is 0, as described above. Since the input signal includes a DC offset component (refer to a dash-dot line), however, the input signal is biased to the positive side. In FIG. 22 (a), only an envelope of the input signal (refer to a shaded area) is shown.

In FIG. 22(b), the gain of the AGC amplifier varies a high gain to a low gain at a head portion of a received signal when the received signal rises abruptly. The reason for the high gain at the head portion is that the gain is controlled so as to maintain the amplitude of the signal received by the AGC amplifier in a constant voltage level. The AGC amplifier requires some time until it controls the gain to obtain an appropriate gain. Therefore, in the signal outputted by the AGC amplifier, its amplitude becomes extremely large at the head portion and then converges on a prescribed amplitude, as shown in FIG. 22(c). FIG. 22(c) shows only an envelope (refer to a shaded area) of the output signal.

As described above, when the signal inputted to the AGC amplifier includes a prescribed DC offset component, the DC offset component appearing in the signal outputted from the AGC amplifier profoundly varies according to variation of the gain. That is, as shown in FIG. 22(c), the voltage level of the DC offset component profoundly varies at the head portion (refer to a chain line). Moreover, when signals with various strength are received, the magnitude of the DC offset component appearing in the output signal of the AGC amplifier varies by signal.

When the conventional DC offset compensation device is used in this situation, since a sufficiently large time constant is given not to distort signals, as shown in FIG. 22(d), the DC offset component profoundly varied at the head portion of the signal cannot be immediately compensated and remains in the digital output dout for a long time. On the other hand, if the time constant is set to be small so as to immediately compensate the DC offset component at the head portion of the signal, the DC offset component follows the variation of the signal itself to distort the signal. In addition, at the head portion of the signal, the amplitude is extremely large, and may be saturated or distorted. Therefore, the small time constant disturbs the operation of the DC offset compensation device and causes an erroneous operation.

Furthermore, DC offset compensation devices for eliminating the DC offset component of the input signal other than the DC offset compensation device shown in FIG. 21 are disclosed in U.S. Pat. No. 5,241,702 and U.S. Pat. No. 5,212,826. Similarly, when these DC offset compensation devices are applied to the receiver having the AGC amplifier, the DC offset component extremely varied at the head portion of the input signal cannot be compensated immediately, and when the time constant is set small so as to immediately compensate the DC offset component at the head portion of the input signal, as in the case described above, the operation of the DC offset compensation device is disturbed and an erroneous operation is caused.

SUMMARY OF THE INVENTION

An object of the present invention is to provide a DC offset compensation device capable of fast DC offset compensation at the head portion of a signal and stable DC offset compensation without distortion of the following portions of the signal when a receiver having an AGC amplifier receives a signal which immediately rises.

To attain the above object, the present invention is directed to a device for compensating DC offset included in an input signal, which comprises:

a level detecting portion detecting variation in amplitude of the input signal to generate and output a level signal which defines a head portion of the input signal;

a time constant control portion generating to output a time constant control signal on the basis of the level signal;

a compensating portion subtracting an estimate of the DC offset from a value of the input signal to output a compensation output; and an estimating portion inputting the compensation output, estimating the DC offset of the input signal on the basis of the compensation output with a time constant which varies according to the time constant control signal, and outputting the estimate to feedback to the compensating portion.

As described above, the level detecting portion detects the variation in the amplitude of the input signal. The time constant control portion generates the time constant control signal for varying the time constant during a period corresponding to the head portion of the input signal. In response, the estimating portion estimates the DC offset with the time constant varying according to the time constant control signal on the basis of the inputted compensation output. Therefore, the estimating portion can vary rapidly (time constant) for estimating the DC offset during the period corresponding to the head portion of the input signal. The DC offset compensation device can be thus configured to be capable of fast DC offset compensation at the head portion of the input signal and stable DC offset compensation at the other portions.

The level signal is a binary signal having a first value or a second value, and a time when the level signal varies from the first value to the second value is taken as a first time, while a time lapsed for a prescribed time from the first time in a state that the level signal has the second value is taken as a second time. In this situation, the time constant control portion outputs the time constant control signal for maximizing the time constant during a period when the level signal keeps on having the second value after the second time.

Therefore, the estimating portion estimates the DC offset while maximizing the time constant when the time constant control signal for maximizing the time constant is inputted. The DC offset compensation device can thus perform stable DC offset compensation when the DC offset of the input signal converges on the vicinity of 0 after the second time.

The time constant control portion may be adapted to generate and output the time constant control signal for minimizing the time constant during a period between the first time and the second time, or the time constant control signal for monotonically increasing the time constant from the minimum to the maximum continuously or stepwise.

Therefore, the estimating portion estimates the DC offset while minimizing the time constant when the time constant control signal for minimizing the time constant is inputted. The DC offset compensation device can thus perform fast DC offset compensation during a period between the first time and the second time. The estimating portion also estimates the DC offset while varying the time constant according to variation in the time constant control signal for monotonically increasing the time constant from the minimum to the maximum continuously or stepwise. The DC offset compensation device can thus perform fast and precise DC offset compensation during the first time and the second time.

The estimating portion can be configured, for example, as in the following: The estimating portion includes a first integrator integrating the compensation signal to output a first integration value, a comparator deciding an upper limit reference value and a lower limit reference value on the basis of the time constant control signal and comparing the first integration value with the decided upper limit reference value and lower limit reference value to output a comparison output, and a second integrator integrating the comparison output to output the estimate. The comparator outputs the comparison output as 0 when the first integration value is more than the lower limit reference value and less than the upper limit reference value, as +1 when the first integration value is not less than the upper limit reference value, and as −1 when the first integration value is not more than the lower limit reference value. The first integrator resets the first integration value when the comparison output is +1 or −1. Therefore, the estimating portion generates different comparison outputs according to the time constant control signal, and generates an estimate to which these comparison outputs are cumulatively added. Thus, the frequency with which the comparator outputs the comparison output represented by +1 or −1 is high when the time constant control signal has a small value. The estimating portion can hasten the speed (time constant) for estimating the DC offset according to the frequency of outputting the comparison output represented by +1 or −1.

The first integrator can be configured, for example, as in the following: In a first structure, the first integrator has a quantizer quantizing the compensation output according to its amplitude and generating to output a quantization signal, a first register holding the first integration value and a first adder adding the quantization signal to the first integration value held by the first register and taking the addition result as a first integration value.

In a second structure, the first integrator has a quantizer quantizing the compensation output according to its amplitude and generating to output a quantization signal, and a first up/down counter generating to output the first integration value on the basis of the quantization signal. The first up/down counter changes a counting direction according to the quantization signal.

The first integrator cumulatively adds the compensation outputs in the first or second structure. Furthermore, in the second structure, since the first integrator is configured by the first up/down counter, the number of its components can be decreased and the circuit configuration of the DC offset compensation device can be simplified and downsized, compared with the first structure.

The quantizer is configured to quantize the compensation output, according to its amplitude, to two values of {+1, −1} or three values of {+1, 0, −1} to output the quantization signal.

Therefore, the estimating portion estimates the DC offset independently of the amplitude of the compensation output. Thus, an erroneous operation hardly occurs when DC offset compensation of a signal which has a large amplitude at the head portion of the input signal is performed.

Moreover, the second integrator can be configured, for example, as in the following: In a first structure, the second integrator has a second register holding the estimate and a second adder adding the comparison output to the estimate held by the second register and taking the addition result as an estimate.

In a second structure, the second integrator has a second up/down counter generating to output the estimate on the basis of the comparison output. The second up/down counter changes a counting direction according to the inputted comparison output.

The second integrator integrates the comparison output and outputs the estimate in the first or second structure. Furthermore, in the second structure, since the second integrator is configured by the second up/down counter, the number of its components can be decreased and the circuit configuration of the DC offset compensation device can be simplified and downsized, compared with the first structure.

The estimating portion may be configured a in the following: In another first structure, the estimating portion includes a correction constant generator generating a correction constant according to the time constant control signal, an adder/subtractor selecting addition or subtraction according to the compensation output and a register holding the estimate. The adder/subtractor adds the estimate held by the register to the correction constant to output the addition result as an estimate when the compensation output is positive. The adder/subtractor subtracts the correction constant from the estimate held by the register to output the subtraction result as an estimate when the compensation output is negative.

As described above, since the correction constant generator includes the adder/subtractor selecting addition or subtraction on the basis of the sign of the compensation output, the correction constants representing positive and negative do not have to be generated. Therefore, the number of components of the correction constant generator can be decreased and the circuit configuration of the DC offset compensation device can be simplified and downsized.

In another second structure, the estimating portion includes a correction constant generator generating a positive correction constant and a negative correction constant according to the time constant control signal to output either one of the correction constants according to the compensation output, a register holding the estimate and an adder adding the correction constant outputted from the correction constant generator to the estimate held by the register to output the addition result as an estimate. The correction constant generator outputs the positive correction constant when the compensation output is positive. The correction constant generator outputs the negative correction constant when the compensation output is negative.

As described above, the correction constant generator generates the positive correction constant and negative correction constant according to the time constant control signal. Therefore, the positive and negative correction constants can be independently set. Furthermore, since the estimating portion is configured by the adder, the circuit configuration of the DC offset compensation device can be simplified and downsized.

To attain the above object, the present invention is also directed to a device for compensating DC offset included in an input signal, which comprises:

a level detecting portion detecting variation in amplitude of the input signal to generate and output a level signal which defines a head portion of the input signal;

a time constant control portion generating to output a time constant control signal on the basis of the level signal;

a compensating portion subtracting an estimate of the DC offset from a value of the input signal to output a compensation output; and an estimating portion inputting the input signal, estimating the DC offset of the input signal with a time constant which varies according to the time constant control signal and outputting the estimate to feed forward to the compensating portion.

As described above, the level detecting portion detects the variation in the amplitude of the input signal. The time constant control portion generates the time constant control signal for varying the time constant during a period corresponding to the head portion of the input signal. In response, the estimating portion estimates the DC offset with the time constant varying according to the time constant control signal from the inputted input signal. Therefore, the estimating portion can vary the rapidity for estimating the DC offset during the period corresponding to the head portion of the input signal. The DC offset compensation device can be thus configured to be capable of fast DC offset compensation at the head portion of the input signal and stable DC offset compensation at the other portions.

The estimating portion is a low-pass filter varying a tap coefficient according to the time constant control signal.

Therefore, the estimating portion can change the rapidity (time constant) for estimating the DC offset component according to the time constant control signal. The DC offset compensation device can be thus configured to be capable of fast DC offset compensation at the head portion of the input signal and stable DC offset compensation at the other portions.

Further, the level detecting portion described above can be configured, for example, as in the following: In a first structure, the level detecting portion inputting the input signal includes a high pass filter generating to output a high pass signal from which a low frequency component of the input signal is eliminated, a rectifier generating to output a rectification output obtained by rectifying the high pass signal and a smoothing unit generating to output a smooth output with time varying of the rectification output reduced. The level detecting portion outputs the level signal on the basis of the smooth output.

In a second structure, the level detecting portion inputting the compensation output includes a rectifier generating to output a rectification output obtained by rectifying the compensation output and a smoothing unit generating to output a smooth output with time variation of the rectification output reduced. The level detecting portion outputs the level signal on the basis of the smooth output.

In the first or second structure, as outputting the level signal according to the smooth output, the level detecting portion detects the head portion of the input signal inputted to the DC offset compensation device from the AGC amplifier. Furthermore, in the second structure, the level detecting portion generates to output the level signal from the compensation output. DC offset is almost eliminated from this compensation output. Therefore, in the second structure, the level detecting portion does not require a high pass filter. The number of components of the level detecting portion can be decreased and the circuit configuration of the DC offset compensation device can be simplified and downsized.

The level signal generated by the level detecting portion having the first or second structure is a binary signal having a first value or a second value. The level detecting portion compares the smooth output and a prescribed reference value, and takes the level signal as the second value when the smooth output is continuously larger than the prescribed reference value for a prescribed judging time and as the first value when otherwise.

Therefore, if the smooth output exceeds the reference value for a moment by a noise or variation of the signal, an erroneous level signal is not generated and a rate of an erroneous operation of the level detecting portion can be small.

In a third structure, the level detecting portion inputting the input signal includes a high pass filter generating to output a high pass signal from which a low frequency component of the input signal is eliminated, a rectifier generating to output a rectification output obtained by rectifying the high pass signal, a smoothing unit generating to output a smooth output with time variation of the rectification output reduced, a threshold generating portion time-averaging the smooth output and generating to output a threshold formed by multiplying the time-averaged smooth output by a prescribed coefficient not less than 1 and a judging portion comparing the smooth output inputted by the smoothing unit with the threshold and generating to output a judgment output representing whether the smooth output is larger or smaller than the threshold. The level detecting portion outputs the level signal on the basis of the judgment output.

In the third structure, the threshold generating portion generates to output the threshold formed by multiplying the time-averaged smooth output by the prescribed coefficient not less than 1. The level judging portion outputs the level signal on the basis of the judging result whether the smooth output is larger or smaller than the threshold. Therefore, a level of the smooth output at the head portion of the signal does not become sufficiently large, the head portion of the signal can be precisely detected.

In the level detecting portion having the third structure, the level signal is a binary signal having a first value or a second value. The level detecting portion takes the level signal as the second value when the judgment output continuously becomes a large value for a prescribed judging time and as the first value when otherwise.

In the third structure, the level detecting portion takes the level signal as the second value only when the judgment output continuously becomes the large value for the prescribed judging time. Therefore, if the smooth output is above the reference value for a moment by a noise or variation of the signal, an erroneous level signal is not generated and a rate of an erroneous operation of the level detecting portion can be small.

Furthermore, in a fourth structure, the level signal outputted from the level detecting portion is a binary signal having a first value or a second value. The level detecting portion inputting the input signal includes a high pass filter generating to output a high pass signal from which a low frequency component of the input signal is eliminated, a rectifier generating to output a rectification output obtained by rectifying the high pass signal, a smoothing unit generating to output a smooth output with time varying of the rectification output reduced, a threshold generating portion time-averaging the smooth output and generating to output a threshold formed by multiplying the time-averaged smooth output by a prescribed coefficient not less than 1, a delay portion generating to output a delayed threshold obtained by delaying the threshold for not less than a prescribed judging time and a judging portion comparing the smooth output with the delayed threshold and generating to output a judgment output representing whether the smooth output is larger or smaller than the threshold. The level detecting portion then takes the level signal as the second value when the judgment output continuously becomes a large value for the prescribed judging time and as the first value when otherwise.

In the fourth structure, the threshold generating portion generates to output the threshold formed by multiplying the time-averaged smooth output by the prescribed coefficient not less than 1. The delay portion generates to output the delayed threshold obtained by delaying the threshold for not less than the prescribed judging time. The level detecting portion takes the level signal as the second value only when the smooth output continuously becomes larger than the delayed threshold for the prescribed judging time. Therefore, at the head portion of the signal, if the threshold varies following the level varying of the signal, since the delayed threshold holds a value before varying, without receiving the effect of the level varying during the judging time, an erroneous operation in detecting the head portion of the signal can be prevented.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 20(a) to 20(d) are diagrams schematically showing waveforms in the main portions of the level detector 2 shown in FIG. 18;

FIG. 21 is a block diagram showing a structure of the conventional DC offset compensation device; and FIGS. 22(a) to 22(d) are diagrams for describing problems when the DC offset compensation device shown in FIG. 21 is applied to a receiver having an AGC amplifier.

DESCRIPTION OF THE PREFERRED EMBODIMENTS (First embodiment)

Figure 1:
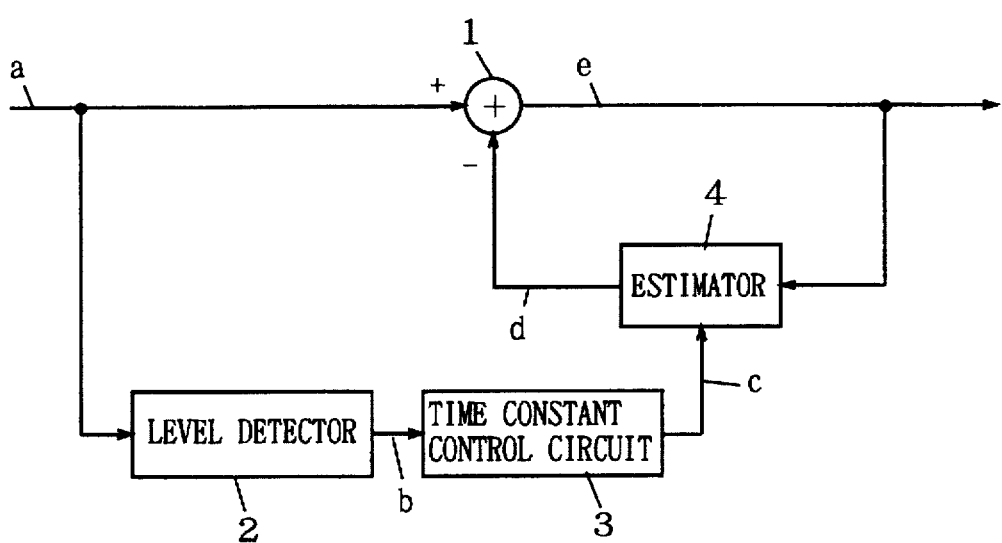
FIG. 1 is a block diagram showing the structure of a DC offset compensation device according to a first embodiment of the present invention.

FIG. 1 is a block diagram showing a DC offset compensation device according to a first embodiment of the present invention. In FIG. 1, the DC offset compensation device includes a compensator 1, a level detector 2, a time constant control circuit 3 and an estimator 4. The compensator 1 subtracts an estimate d inputted from the estimator 4 from an input signal a (refer to FIG. 20(a)) inputted from an AGC amplifier (not shown). The compensator 1 outputs the subtraction result as a compensation output e. The estimator 4 inputs the compensation output e to generate the estimate d. Specifically, the estimator 4 increases the estimate d when a DC offset component of the compensation output e is positive, and decreases the estimate d when the DC offset component of the compensation output e is negative. The compensator 1 and the estimator 4 configure a feedback control loop, resulting in that the DC offset component of the compensation output e converges on 0. That is, the estimate d converges on a value of a DC offset component of the input signal a. The input signal a is also provided for the level detector 2. The level detector 2 generates a level signal b having a first value representing HIGH or a second value representing LOW according to the amplitude of the input signal a, and outputs the level signal b to the time constant control circuit 3. HIGH and LOW are represented by HIGH and LOW of a logical circuit, respectively, for example. The time constant control circuit 3 generates a time constant control signal c on the basis of the level signal b and provides the time constant control signal c for the estimator 4. The estimator 4 varies the time constant of an estimating operation on the basis of the time constant control signal c.

The structure and operation of the DC offset compensation device of the first embodiment are subsequently described in more detail referring to FIGS. 2 to 8(a)–8(f). FIGS. 2 to 7 are diagrams showing more detailed structures of each portion of the DC offset compensation device shown in FIG. 1. FIGS. 8(a)–8(f) are diagrams schematically showing waveforms in the main portions of the DC offset compensation device shown in FIG. 1. FIG. 8(a) shows a waveform of the signal (the input signal a) inputted to the DC offset compensation device. In FIG. 8(a), since the input signal a is the same as that in FIG. 20(c), the description is omitted. FIGS. 8(b)–8(f) are subsequently described when required.

Figure 2:
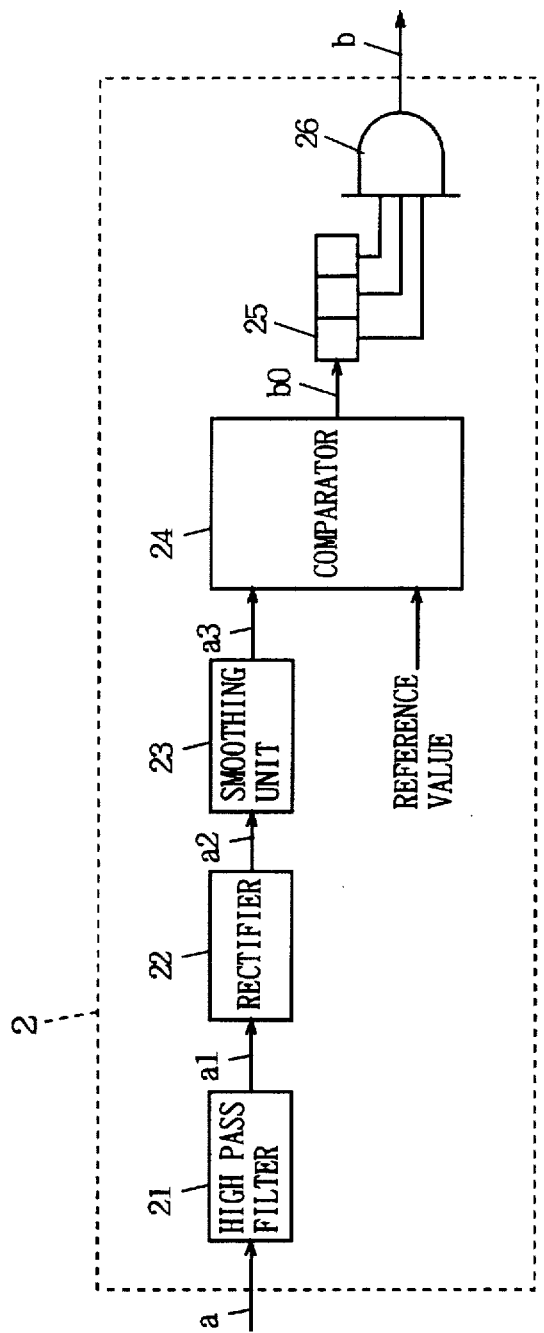
FIG. 2 is a block diagram showing a detailed structure of a level detector 2 shown in FIG. 1.

FIG. 2 is a block diagram showing a more detailed structure of the level detector 2 shown in FIG. 1. In FIG. 2, the level detector 2 includes a high pass filter 21, a rectifier 22, smoothing unit 23, a comparator 24 (as an example of a to judging means), a shift register 25 and an AND circuit 26. The high pass filter 21 eliminates a low frequency component in the vicinity of a direct current in the input signal a to generate a high pass signal a1. The high pass filter 21 is to prevent an erroneous operation of the level detector 2 by the DC offset component of the input signal a. The rectifier 22 calculates an absolute value of the high pass signal a1 to generate a rectification output a2. The smoothing unit 23 is a low pass filter or an integrator which smooths a waveform of the rectification output a2 to generate a smooth output a3.

The smooth output a3 is outputted as a string of sample values by a certain sampling time. The comparator 24 compares and judges whether the smooth output a3 is larger or smaller than a prescribed reference value by the sampling time. As a result of the judgment, the comparator 24 outputs a comparison output b0 (judgment output b0) having a value of 1 when the smooth output a3 is larger than the reference value or a value of 0 when the smooth output a3 is smaller than the reference value. The shift register 25 shifts its content with the comparison output b0 being inputted by the sampling time, and stocks the current three bits of the comparison output b0 to output them in parallel. The AND circuit 26 calculates the logical product from the three bits of the comparison output b0. The AND circuit 26 generates the level signal b (refer to FIG. 8(b)) representing HIGH when the obtained logical product is 1 or LOW when the obtained logical product is 0, and outputs the level signal b to the time constant control circuit 3. That is, the level signal b becomes HIGH when the comparison output b0 is 1 for three consecutive samples, and becomes LOW when otherwise. The prescribed reference value is set to a higher value (preferably about 1.5 to 3 times) than a voltage level of the smooth output a3 obtained as an output from the smoothing unit 23 when a signal outputted from the AGC amplifier in a state of constant convergence of the gain is taken as the input signal a of the level detector 2.

The shift register 25 and the AND circuit 26 described above are provided to prevent an erroneous operation of the level detector 2 due to an effect of noise etc. That is, the level detector 2 keeps the level signal b LOW when the comparison output b0 becomes 1 for a moment due to the effect of noise etc., and makes the level signal b HIGH using a characteristic that the comparison output b0 maintains a state of 1 for a certain period of time when the level of the signal is truly varied. Thus, the level detector 2 does not operate erroneously. While the number of bits of the shift register 25 and the AND circuit 26 are three, the number of bits is not limited to three and should be defined according to requirements of the system design. Further, the shift register 25 and the AND circuit 26 can be omitted and the smooth output a3 can be taken as the level signal b, as it is (in this case, the number of bits is 0). Further, the larger the number of bits, the smaller the probability that the level signal b erroneously becomes HIGH due to noise etc., but the larger the probability that detection of true level varying of the signal fails.

The level signal b is subsequently described. FIG. 8(b) shows a waveform of the level signal b generated by the level detector 2. The input signal a is inputted to the level detector 2 (refer to FIG. 8(a)), the amplitude of the input signal a becomes large at the head portion, i.e., for a period until the gain of the AGC amplifier converges. Therefore, the level signal b in FIG. 8(b) becomes HIGH for a short period of time at the head portion of the input signal a, and becomes LOW for other periods.

Figure 3:
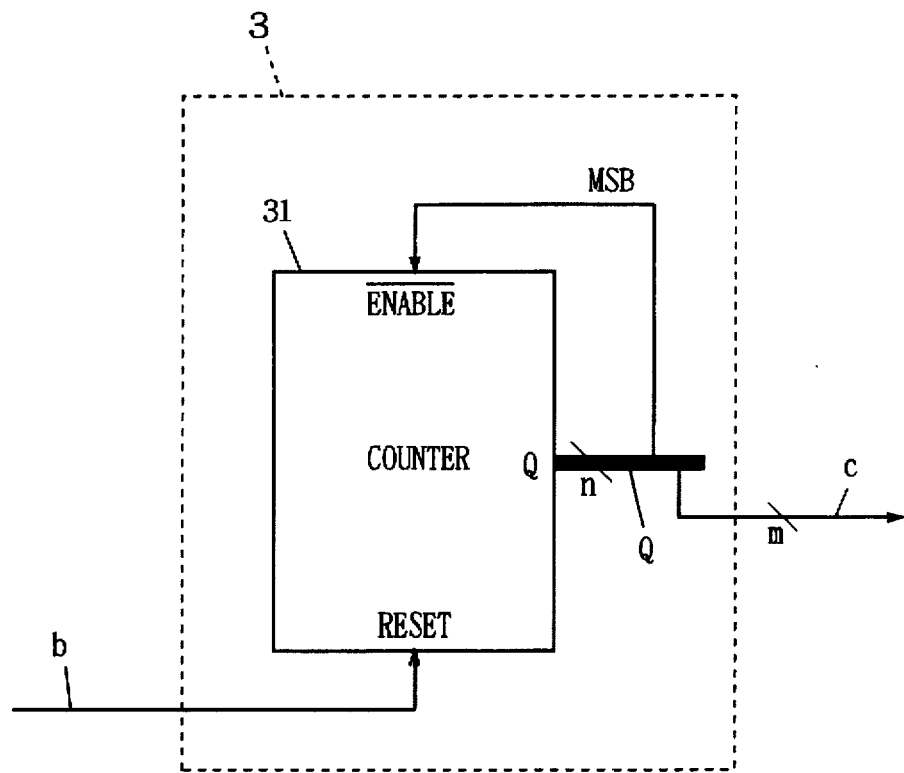
FIG. 3 is a block diagram showing a detailed structure of a time constant control circuit 3 shown in FIG. 1.

FIG. 3 is a block diagram showing a detailed structure of the time constant control circuit 3 shown in FIG. 1. In FIG. 3, the time constant control circuit 3 includes a counter 31. The counter 31 is a counter counting up from 0 to the (n–1)-th power of 2 for a certain period of time, and is constructed so as to stop when the count value reaches the (n–1)th power of 2. In more detail, the counter 31 inputs the level signal b through a reset terminal. The counter 31 performs a counting operation when the level signal b is LOW, and when the level signal b is HIGH, the counter 31 resets the counting operation, whereby the count value Q becomes 0. In this situation, the counter 31 outputs a significant m bit (m≦n−1) of the count value Q as a time constant control signal c from a Q terminal. At the same time, the most significant bit (MSB) of the count value Q is inputted to an enable bar terminal (a bar is on the upper portion of ENABLE in FIG. 3 for description). The counter 31 stops the counting operation when the MSB of the (n−1)-th power of 2 is inputted to the enable bar terminal. As a typical circuit, If m=1, the size of the circuit becomes the smallest. In this case, the time constant control signal c is a binary signal. The time constant control signal c is a signal which controls a time for compensating the DC offset component. That is, the smaller a numerical value of a significant m bit outputted as the time constant control signal c, the shorter the time for compensating the DC offset component. The larger the numerical value of the significant m bit, the longer the time for compensating the DC offset component. When m≧2, the time for compensating the DC offset can be finely controlled.

FIG. 8(c) is a diagram showing the time constant control signal c (m=1). In FIG. 8(c), the time constant control signal c is a binary signal which is 0 or 1. When the level signal b is HIGH, as is clear from the above, the counter 31 outputs 0 as the time constant control signal c. The counter 31 counts up from 0 when the level signal b is LOW. Therefore, the numerical value of the significant m bit varies from 0 to 1 after a lapse of a certain period of time, and the time constant control signal c becomes 1. Therefore, the counter 31 continues to output 0 as the time constant control signal c before the lapse of the certain period of time. FIGS. 8(d) and 8(e) respectively shows the time constant control signal c when m=2 and m>>1. Since each of methods of generating the time constant control signal c in each case is basically the same as that shown in FIG. 8(a), the description is omitted. As shown in FIG. 8(d) or FIG. 8(e), when the time constant control signal c is monotonically increased from the minimum to the maximum stepwise or continuously, the time for compensating the DC offset can be finely controlled as described above.

Figure 4:
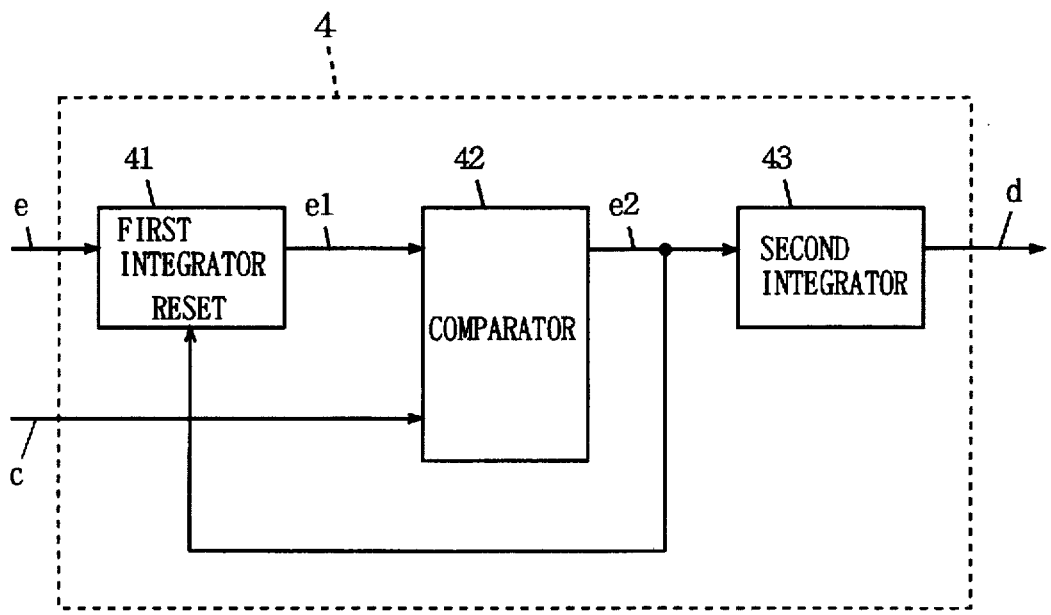
FIG. 4 is a block diagram showing a detailed structure of an estimator 4 shown in FIG. 1.

FIG. 4 is a block diagram showing the detailed structure of the estimator 4 shown in FIG. 1. In FIG. 4, the estimator 4 includes a first integrator 41, a comparator 42 and a second integrator 43. The compensation signal e is first integrated at the first integrator 41 to become a first integration output e1. The comparator 42 compares the first integration output e1 with a reference value (described later) defined by the time constant control signal c to obtain a comparison output e2. The second integrator 43 integrates the comparison output e2 to obtain the estimate d. The first integrator 41 is reset when the comparison output e2 is other than 0.

Figure 5:
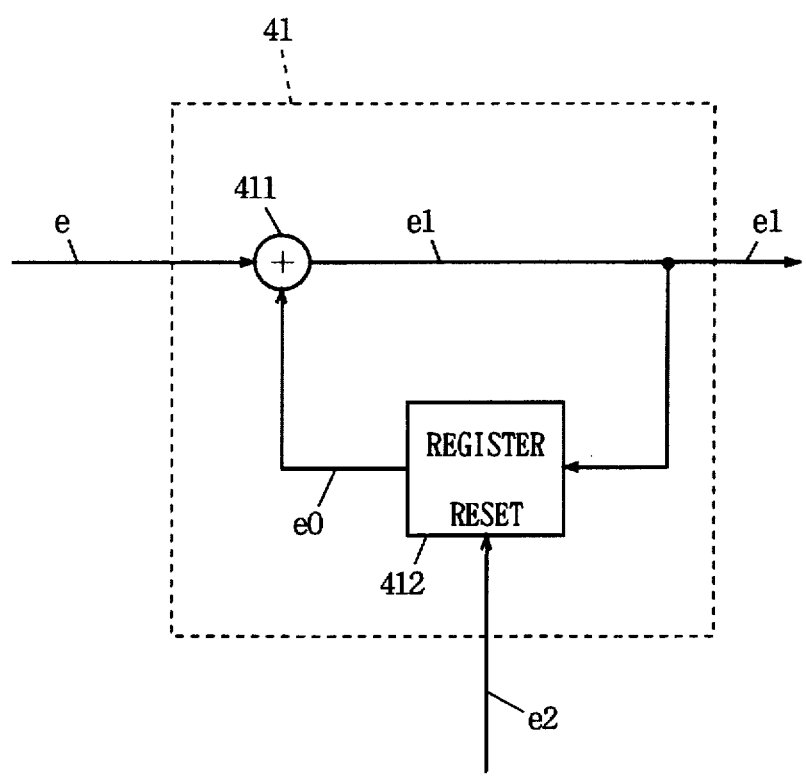
FIG. 5 is a block diagram showing an example of a first structure of a first integrator 41 shown in FIG. 4.

FIG. 5 is a block diagram showing an example of a first structure of the first integrator 41 shown in FIG. 4. In FIG. 5, the first integrator 41 includes an adder 411 and a register 412. The register 412 normally stores outputs from the adder 411, and resets its held value e0 to 0 when receiving a reset signal. The reset signal is a comparison output e2 (described later) having a value other than 0 outputted by the comparator 42. The adder 411 adds the compensation output e to the held value e0 of the register 412 to obtain the first integration output e1. Therefore, the first integrator 41 cumulatively adds the inputted signals during a period of not being reset by the comparison output e2.

Figure 6:
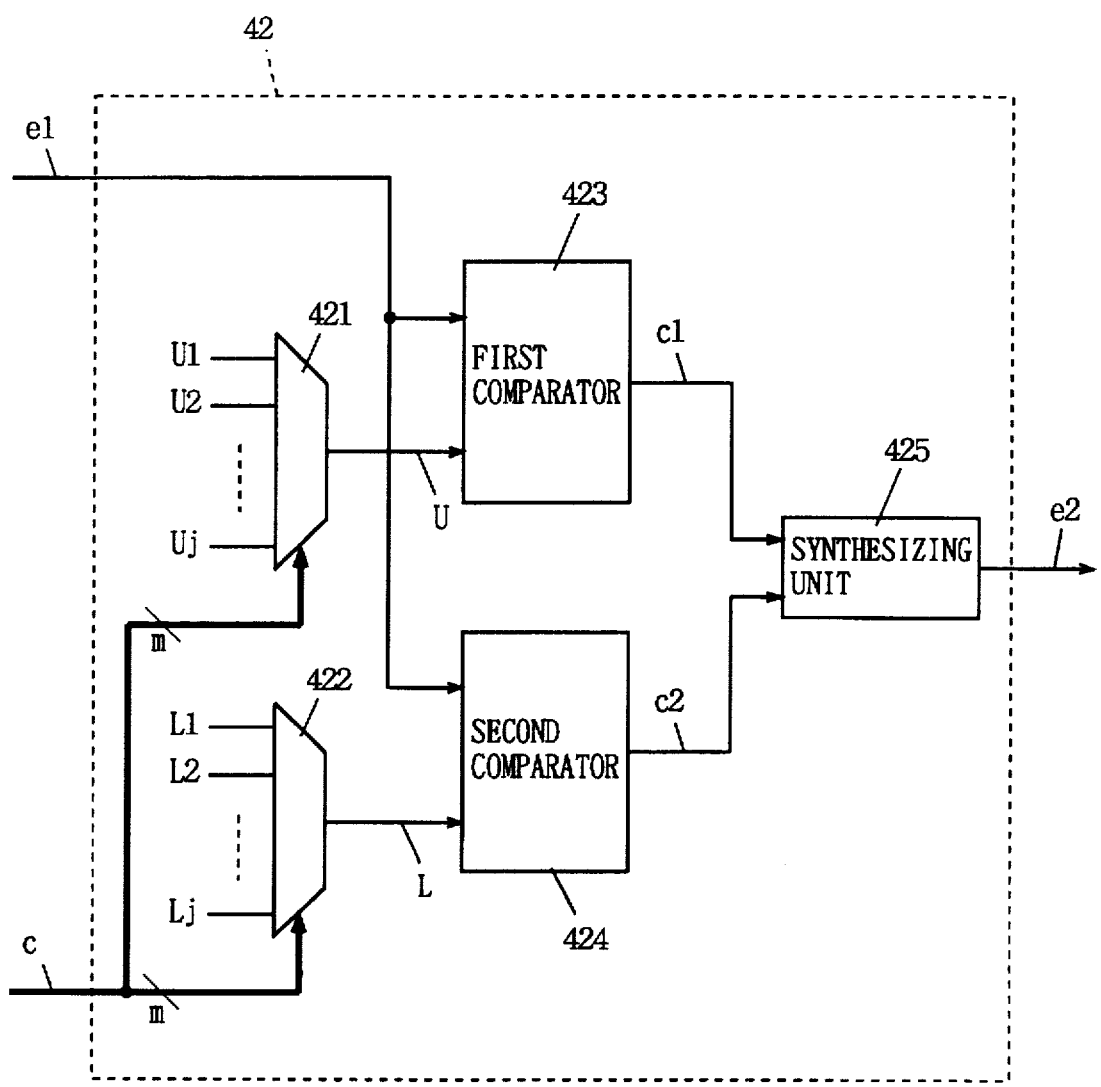
FIG. 6 is a block diagram showing a detailed structure of a comparator 42 shown in FIG. 4.

FIG. 6 is a block diagram showing a more detailed structure of the comparator 42 shown in FIG. 4. In FIG. 6, the comparator 42 includes a first selector 421, a second selector 422, a first comparator 423, a second comparator 424 and a synthesizing unit 425. The first selector 421 selects one of prescribed constants U1 to Uj on the basis of the time constant control signal c, and takes the selected constant as an upper limit reference value U. The second selector 422 selects one of prescribed constants L1 to Lj on the basis of the time constant control signal c, and takes the selected constant as a lower limit reference value L. It is provided that j is the m-th power of 2. The upper limit reference value U is a positive number, and is set to be selected to be a larger value as the time constant control signal c is larger. The lower limit reference value L is a negative number, and is set to be selected to be a smaller value as the time constant control signal c is smaller. The first comparator 423 outputs a first comparison output c1 representing 1 when the first integration output e1 is not less than the upper limit reference value U, and outputs a first comparison output c1 representing 0 when otherwise. The second comparator 424 outputs a second comparison output c2 representing −1 when the first integration output e1 is not more than the lower limit reference value L, and outputs a second comparison output c2 representing 0 when otherwise. The synthesizing unit 425 outputs +1 as a comparison output e2 when the first comparator 423 outputs the first comparison output c1 representing 1. The synthesizing unit 425 outputs −1 as a comparison output e2 when the second comparator 424 outputs the second comparison output c2 representing −1. Further, the synthesizing unit 425 outputs 0 as a comparison output e2 when the first and second comparators 423 and 424 output the first and second comparison outputs c1 and c2 both representing 0.

Figure 7:
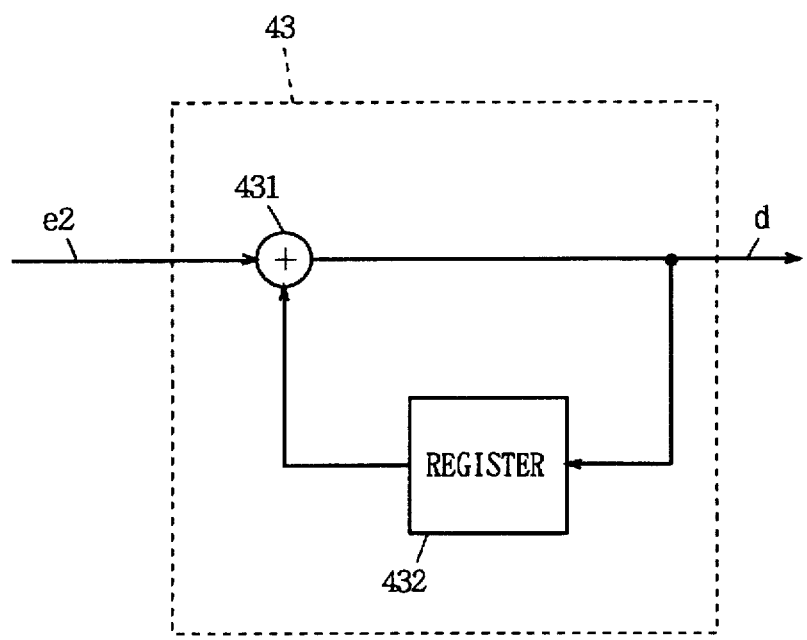
FIG. 7 is a block diagram showing an example of a first structure of a second integrator 43 shown in FIG. 4.
Figure 8:
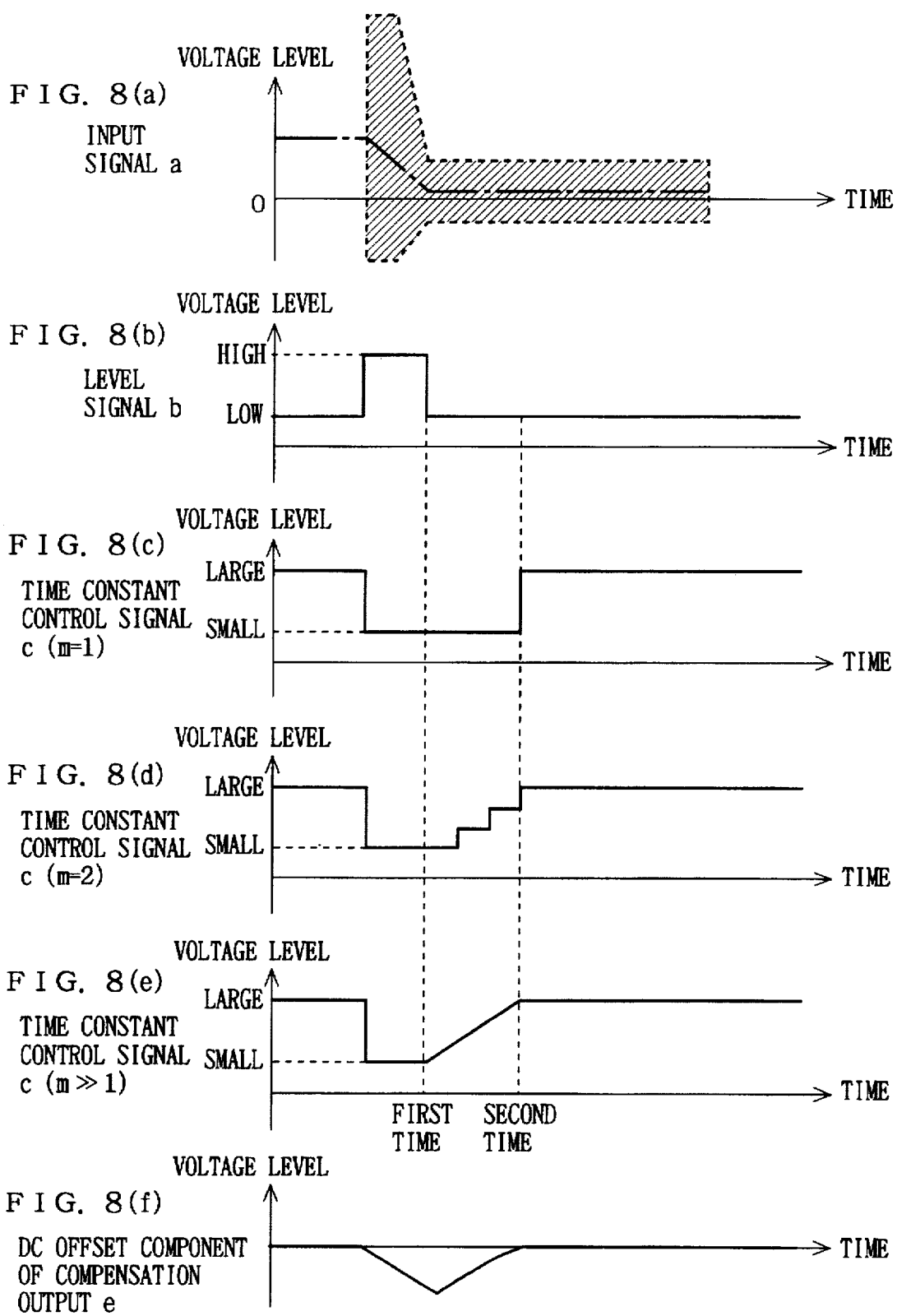
FIGS. 8(a) to 8(f) are diagrams schematically showing waveforms at the main portions of the DC offset compensation device shown in FIG. 1.

FIG. 7 is a block diagram showing an example of the first structure of the second integrator 43 shown in FIG. 4. In FIG. 7, the second integrator 43 includes an adder 431 and a register 432. The second integrator 43 has a structure almost the same as that of the first integrator shown in FIG. 5, and cumulatively adds the comparison output e2 to obtain the estimate d.

Through the above structure, in the estimator 4, the smaller the time constant control signal c, the smaller the upper limit reference value U, and conversely, the larger the lower limit reference value L. Moreover, the first integration output e1 has a value obtained by cumulatively adding the compensation outputs e from 0. Therefore, when the time constant control signal c is small, the first integration output e1 reaches the upper limit reference value U or the lower limit reference value L rapidly. The synthesizing unit 425 thus has the high frequencies of outputting +1 or −1 as the comparison output e2. The second integrator 43 cumulatively adds the comparison outputs e2 to obtain the estimate d. Therefore, when the frequencies of outputting +1 or −1 as the comparison output e2 becomes high, the second integrator 43 outputs the estimate d according to the frequencies. The compensator 1 thus compensates the DC offset component rapidly to output the compensation output e when the value of the time constant control signal c is small.

FIG. 8(f) shows a waveform of the DC offset component included in the compensation output e. In FIG. 8(f), the DC offset component included in the compensation output e approaches 0 rapidly during a period where the time constant control signal c is small, as described above. On the other hand, during a period where the time constant control signal c is large, the DC offset compensation device decreases the DC offset component slowly in the vicinity of 0 and keeps it stable. The DC offset compensation device can thus perform fast DC offset compensation at the head portion of the input signal and stable DC offset compensation at other periods.

Figure 9:
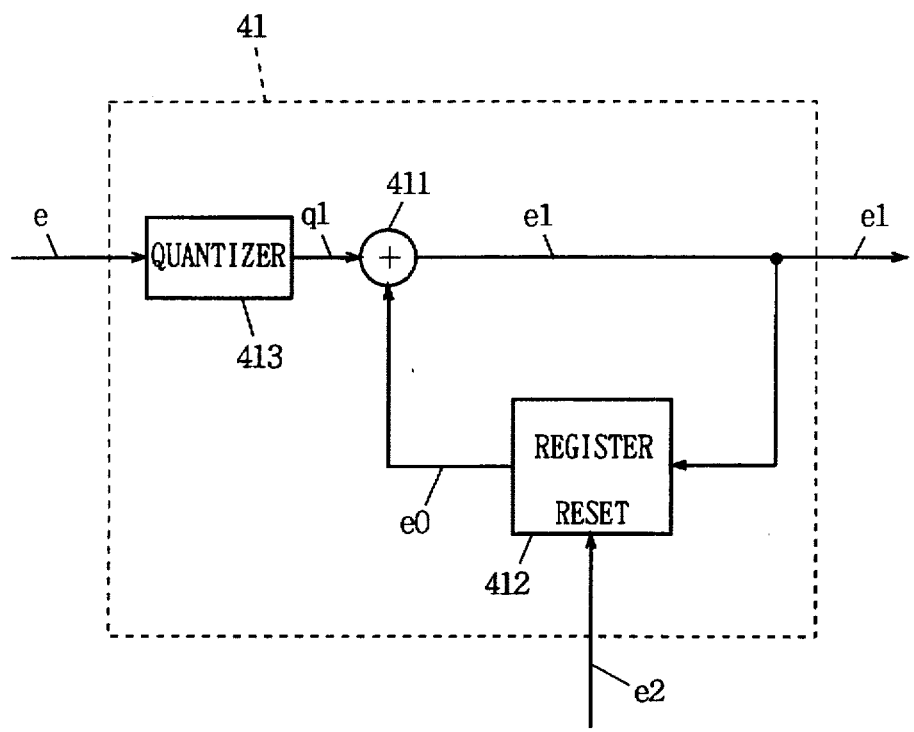
FIG. 9 is a block diagram showing an example of a second structure of the first integrator 41 shown in FIG. 4.

The structure of the first integrator 41 shown in FIG. 4 is not limited to that shown in FIG. 5, but may be the one in the following. FIG. 9 is a block diagram showing an example of a second structure of the first integrator 41 shown in FIG. 4. In FIG. 9, the first integrator 41 is different from the structure shown in FIG. 5 in that a quantizer 413 is included at an inputting side of the adder 411. Since the other structure is the same as the structure for which the same reference numbers are provided in FIG. 5, the description is omitted. The quantizer 413 inputs the compensation output e, and outputs +1, −1, and 0 when the compensation output e is positive, negative, and 0, respectively, as a quantization signal q1. Since this structure makes operations of each portion set in the rear of the quantizer 413 independent of the amplitude of the compensation output e, while there is a disadvantage in the rapidity of the estimating operation with respect to a large DC offset compensation, compared with the structure of the first integrator 41 shown in FIG. 5, there is an advantage in that an erroneous operation due to an input signal with a large amplitude at the head portion of the signal or noise with other large amplitude hardly occurs.

Figure 10:
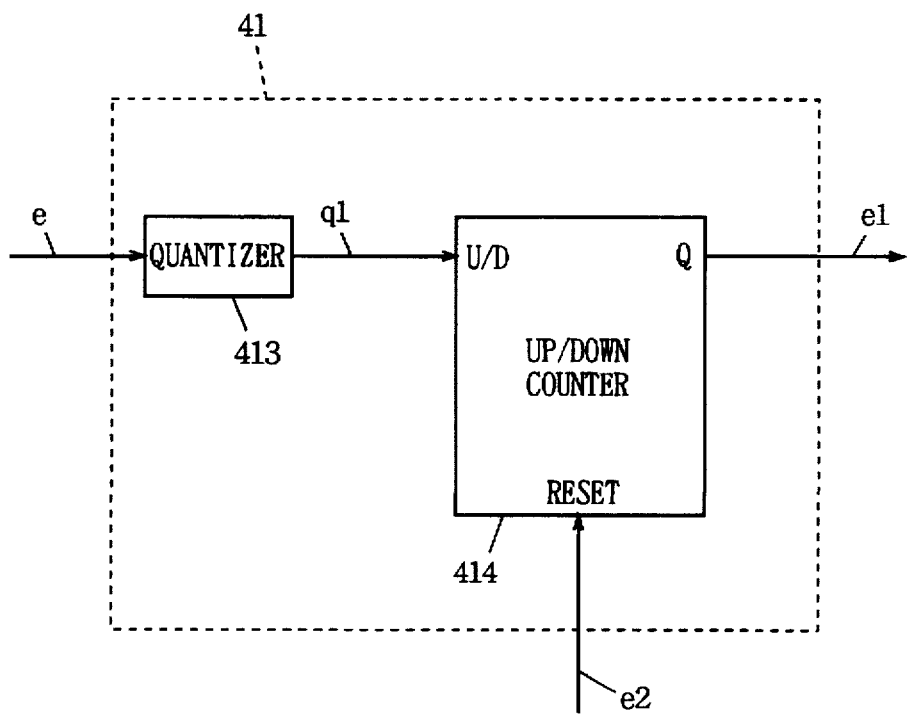
FIG. 10 is a block diagram showing an example of a third structure of the first integrator 41 shown in FIG. 4.

FIG. 10 is a block diagram showing an example of a third structure of the first integrator 41 shown in FIG. 4. In FIG. 10, the first integrator 41 is different from the structure shown in FIG. 9 in that an up/down counter 414 is included instead of the adder 411 and the register 412. Since the other structure is the same as the structure for which the same reference numbers are provided in FIG. 9, the description is omitted. That is, while being formed of the adder 411 and the register 412 in FIG. 9, the cumulative adder is formed of the up/down counter 414 in FIG. 10. The quantizer 413 outputs the quantization signal q1 as the same described above, and controls the counting direction of the up/down counter 414. In more detail, the up/down counter 414 performs up-count when the quantization signal q1 is +1, down-count when the quantization signal q1 is −1, and stops counting when the quantization signal q1 is 0. When the comparison output e2 outputs other than 0, a held count value of the up/down counter is reset to 0. The first integrator 41 shown in FIG. 10 thus operates the same as the first integrator 41 shown in FIG. 9.

In the first integrator 41 shown in FIGS. 9 and 10, although the quantizer 413 outputs 0 as the quantization signal q1 when the compensation output e is 0, since the probability that the compensation output e becomes 0 during actual signal receiving is very small, the quantizer 413 may quantize the compensation output e having a value of 0 to +1 or −1.

Figure 11:
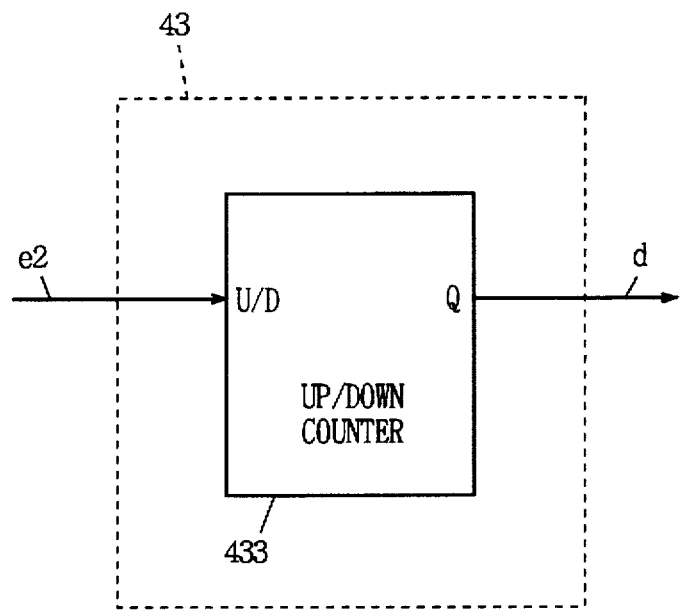
FIG. 11 is a block diagram showing an example of a second structure of the second integrator 43 shown in FIG. 4.

Furthermore, in the DC offset compensation device according to the first embodiment, the second integrator 43 shown in FIG. 4 is not limited to the structure shown in FIG. 7, but may have a structure shown in FIG. 11, for example. FIG. 11 is a block diagram showing an example of a second structure of the second integrator 43 shown in FIG. 4. In FIG. 11, the second integrator 43 includes an up/down counter 433. That is, while being formed of the adder 431 and the register 432 in FIG. 7, the cumulative adder is formed of the up/down counter 433 in FIG. 11. The up/down counter 433 performs up-count when the comparison output e2 is +1, down-count when the comparison output e2 is −1, and stops counting when the comparison output e2 is 0. The second integrator 43 shown in FIG. 11 thus operates the same as the second integrator 43 shown in FIG. 7.

Figure 12:
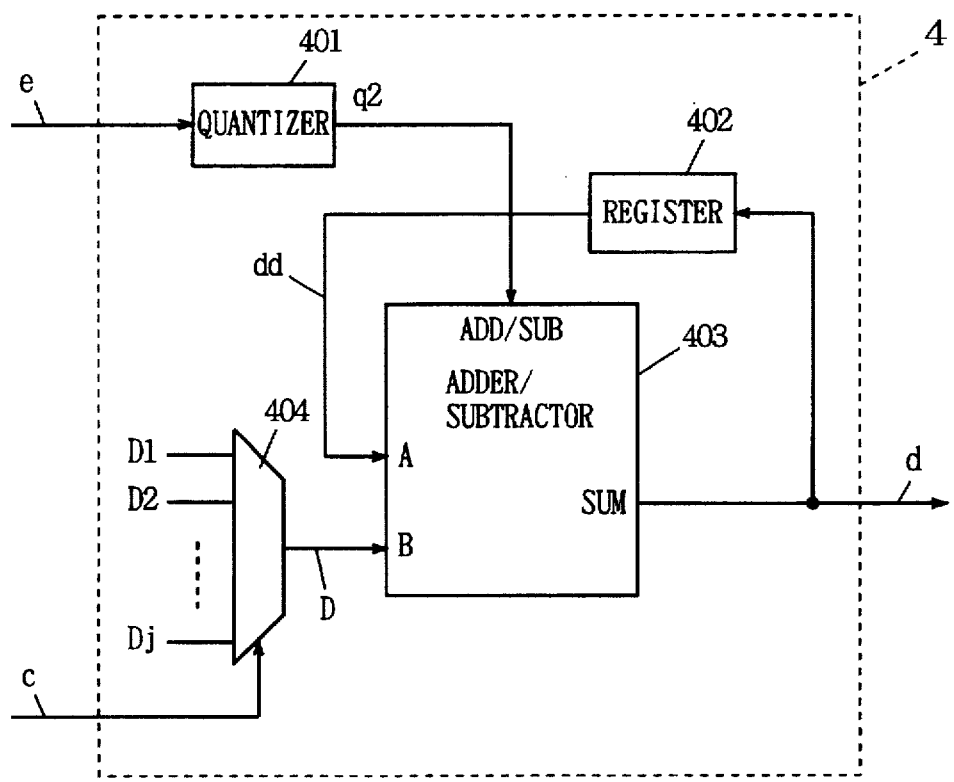
FIG. 12 is a block diagram showing an example of a second structure of the estimator 4 shown in FIG. 1.

Further, in the DC offset compensation device according to the first embodiment, the estimator 4 in FIG. 1 is not limited to the structure shown in FIG. 4, but may have the following structure, for example. FIG. 12 is a block diagram showing an example of a second structure of the estimator 4 shown in FIG. 1. In FIG. 12, the estimator 4 includes a quantizer 401, a register 402, an adder/subtractor 403 and correction constant generator 404. The quantizer 401 quantizes the compensation output e inputted to the estimator 4 to ternary values of +1, 0 or 1 to output to the adder/subtractor 403 as a quantization signal q2. The adder/subtractor 403 changes the operation according to the quantization signal q2. Specifically, the adder/subtractor 403 adds a register output dd to a correction constant D to obtain the estimate d when the quantization signal q2 is +1, subtracts the correction constant D from the register output dd to obtain the estimate d when the quantization signal q2 is −1, and takes the register output dd as it is as the estimate d when the quantization signal q2 is 0. The register 402 holds the estimate d outputted from the adder/subtractor 403 at the immediately preceding sampling time to output the estimate d as the register output dd. That is, the adder/subtractor 403 and the register 402 performs cumulative addition/subtraction. The correction constant generator 404 is a selector which selects one of a plurality of predetermined positive constants according to the time constant control signal c. The correction constant generator 404 selects the correction constant D having a smaller value as the time constant control signal c is larger, and outputs the selected correction constant D to the adder/subtractor 403.

Figure 13:
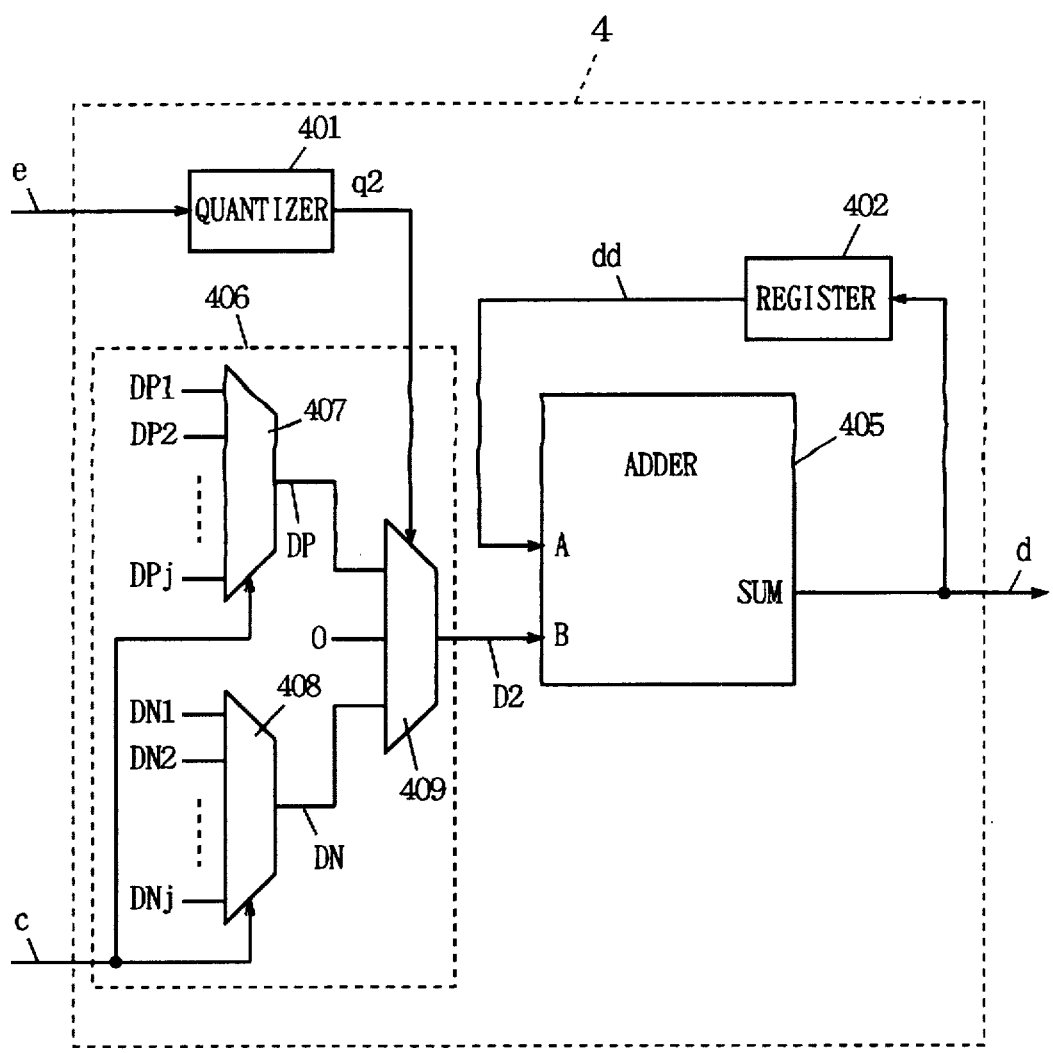
FIG. 13 is a block diagram showing an example of a third structure of the estimator 4 shown in FIG. 1.

FIG. 13 is a block diagram showing an example of a third structure of the estimator 4 shown in FIG. 1. In FIG. 13, the estimator 4 is different from the structure shown in FIG. 12 in that the adder 405 is included instead of the adder/subtractor 403 and that the correction constant generator 406 is included instead of the correction constant generator 404. Since the other structure is the same as the structure for which the same reference numbers are provided in FIG. 12, the description is omitted. The correction constant generator 406 has a first selector 407, a second selector 408 and a third selector 409. The first selector 407 selects one of a plurality of predetermined positive constants DP1 to DPj (j is the m-th power of 2) according to the time constant control signal c, and outputs the selected constant to the third selector 409 as a first correction constant DP. The first selector 407 selects a constant having a larger value as the time constant control signal c is larger. The second selector 408 selects one of a plurality of predetermined negative constants DN1 to DNj (j is the m-th power of 2) according to the time constant control signal c, and outputs the selected constant to the third selector 409 as a second correction constant DN. The second selector 408 selects a constant having a smaller value as the time constant control signal c is larger. The third selector 409 selects one among the first correction constant DP, the second correction constant DN and 0 according to the quantization signal q2, and outputs the selected constant to the adder 405 as a correction constant D2. Specifically, the third selector 409 outputs the first correction constant DP as the correction constant D2 when the quantization signal q2 is +1. The third selector 409 outputs the second correction constant DN as the correction constant D2 when the quantization signal q2 is −1. The third selector 409 outputs 0 as the correction constant D2 when the quantization signal q2 is 0. In this structure, the number of selectors disadvantageously increases compared with the structure shown in FIG. 12. However, since the positive correction constant DP or negative correction constant DN is added instead of the same correction constant D (refer to FIG. 12) being added or subtracted, it is advantageous that the adder can be used instead of the adder/subtractor and that the positive correction constant DP and negative correction constant DN can be separately set.

(Second embodiment)

Figure 14:
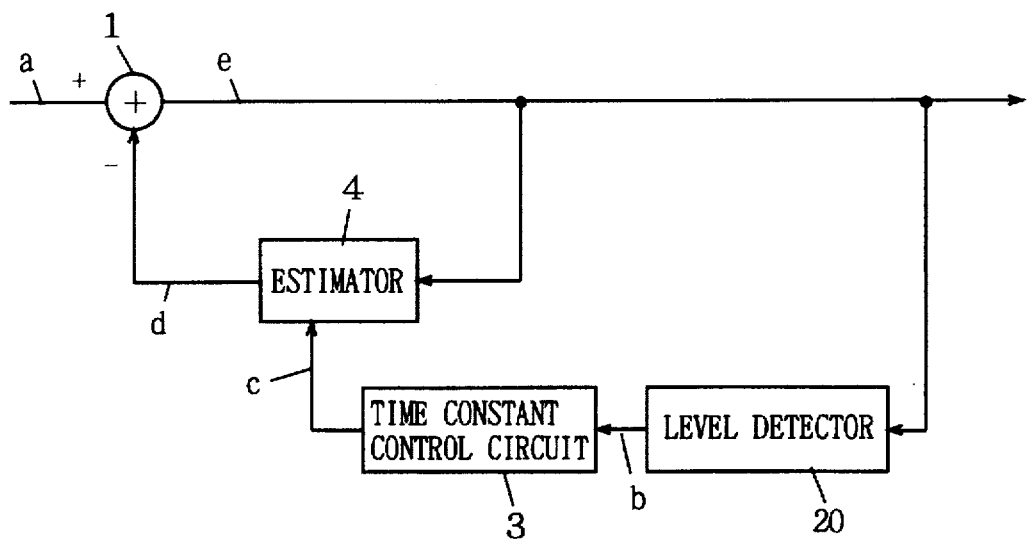
FIG. 14 is a block diagram showing a structure of the DC offset compensation device according to a second embodiment of the present invention.

FIG. 14 is a block diagram showing the structure of the DC offset compensation device according to a second embodiment of the present invention. The DC offset compensation device shown in FIG. 14 is different from the DC offset compensation device shown in FIG. 1 in that a level detector 20 is provided instead of the level detector 2. Since the other structure is the same as the structure for which the same reference numbers are provided in FIG. 1, the description is omitted. The level detector 20 is different from the level detector 2 shown in FIG. 1 in that the level detector 20 inputs the compensation output e to generate the level signal b according to the variation of the amplitude of the compensation output e. Although the level detector 20 may have the structure shown in FIG. 2, it may also have the following structure which is subsequently described.

Figure 15:
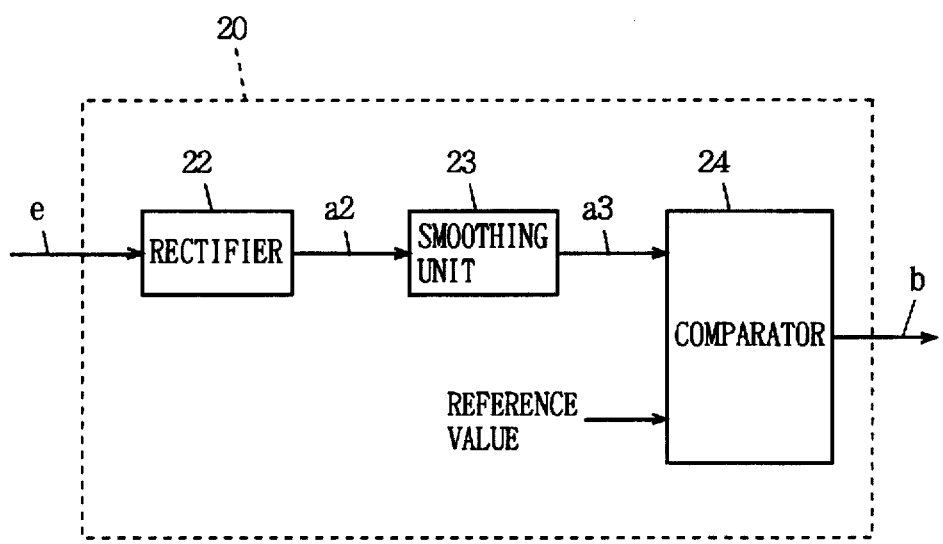
FIG. 15 is a block diagram showing a structure of a level detector 20 shown in FIG. 14.

FIG. 15 is a block diagram showing the structure of the level detector 20 shown in FIG. 14. The level detector 20 has a structure omitting the high pass filter 21, compared with the level detector 2 shown in FIG. 2. Since the other structure is the same as the structure for which the same reference numbers are provided in FIG. 2, the description is omitted. Since the level detector 20 uses the compensation output e as an input, the DC components are almost eliminated. It is thus possible to omit the high pass filter 21.

(Third embodiment)

Figure 16:
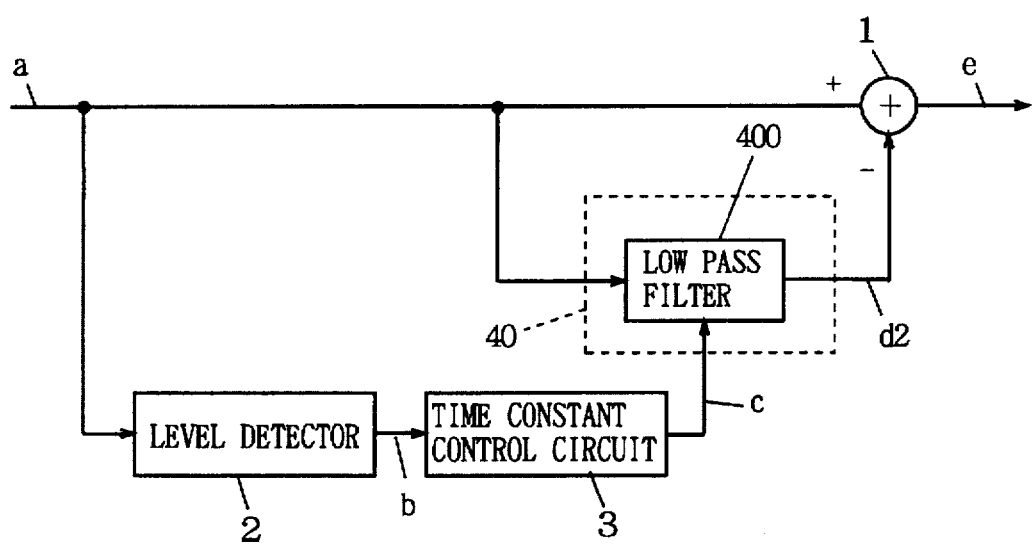
FIG. 16 is a block diagram showing a structure of the DC offset compensation device according to a third embodiment of the present invention.

FIG. 16 is a block diagram showing the structure of the DC offset compensation device according to a third embodiment of the present invention. Compared with the structure shown in FIG. 1, the DC offset compensation device in FIG. 16 is different in that it has a estimator 40 instead of the estimator 4 in FIG. 1, and that the estimator 40 inputs the input signal a while the estimator 4 inputs the compensation output e in FIG. 1. Since the other structure is the same as the structure for which the same reference numbers are provided in FIG. 1, the description is omitted. While the DC offset compensation device shown in FIG. 1 forms a feed-back control loop with the estimator 4 and the compensator 1, the DC offset compensation device shown in FIG. 16 forms a feed-forward control loop with the estimator 40 and the compensator 1. In this case, the estimator 40 generates an estimate d2 from the input signal a independently of the compensation output e from the compensator 1. The estimator 40 is formed of a low pass filter 400 whose gain with respect to the DC components is 1, and the low pass filter 400 can be realized in the following structure subsequently described.

Figure 17:
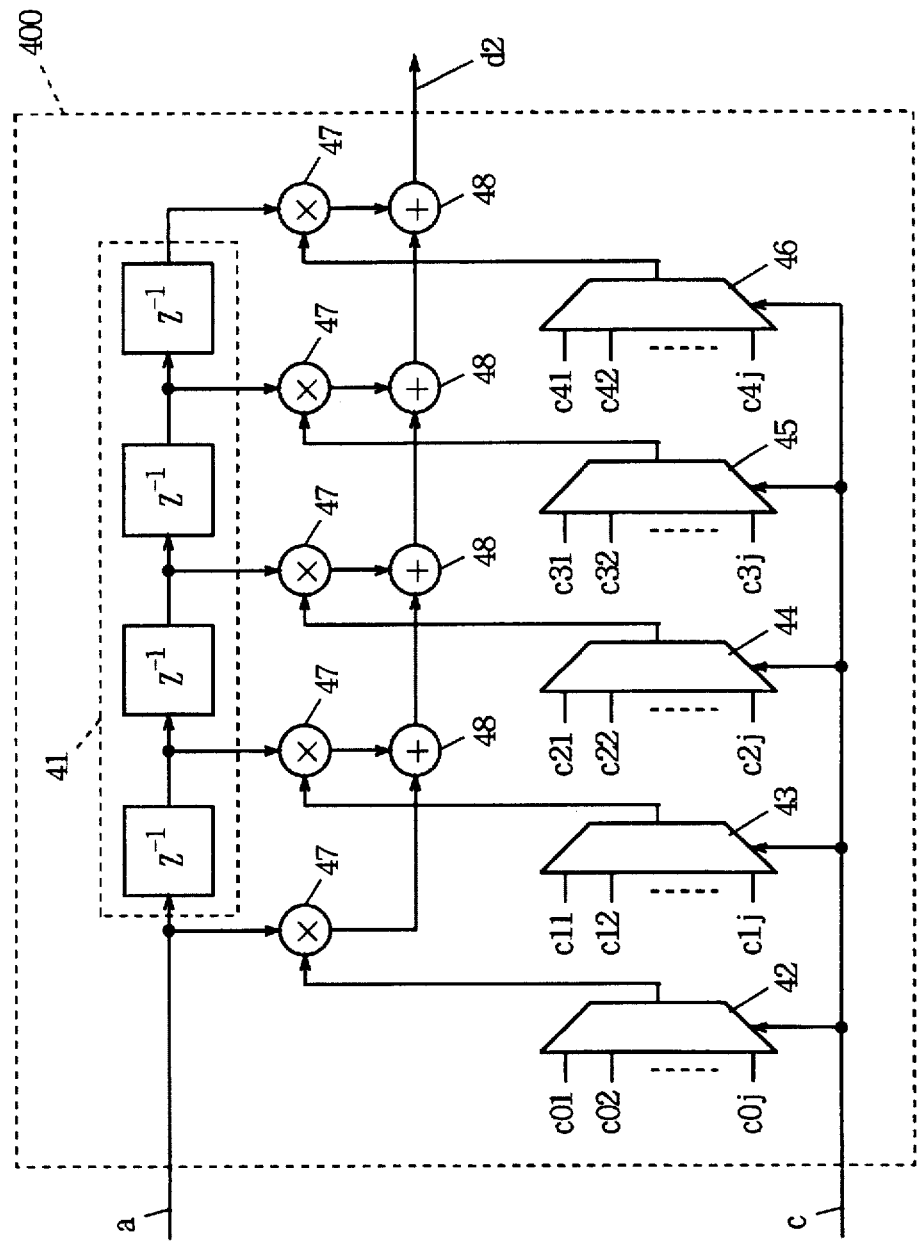
FIG. 17 is a block diagram showing a structure of a low pass filter shown in FIG. 16.

FIG. 17 is a block diagram showing the structure of the low pass filter 400 shown in FIG. 16. In FIG. 17, the low pass filter 400 has a shift register 41, selectors 42 to 46, multipliers 47 and adders 48. The shift register 41, the multipliers 47 and the adders 48 form a transversal-type low pass filter. The characteristic of the filter is decided by a tap coefficient which is an output of the selectors 42 to 46. The selectors 42 to 46 selects one of j pcs (j is the m-th power of 2) of the tap coefficients according to the time constant control signal c. These tap coefficients are defined so that the larger the time constant control signal c, the larger the time constant of the transversal filter (i.e., the lower a cut-off frequency). In this structure, the cut-off frequency is raised to estimate components in the vicinity of direct current of the input signal a when the time constant control signal c is large, while the cut-off frequency is lowered to stably estimate components in the vicinity of direct current of the input signal a when the time constant control signal c is small, and the estimated result is outputted as an estimate d2.

(Fourth embodiment)

Figure 18:
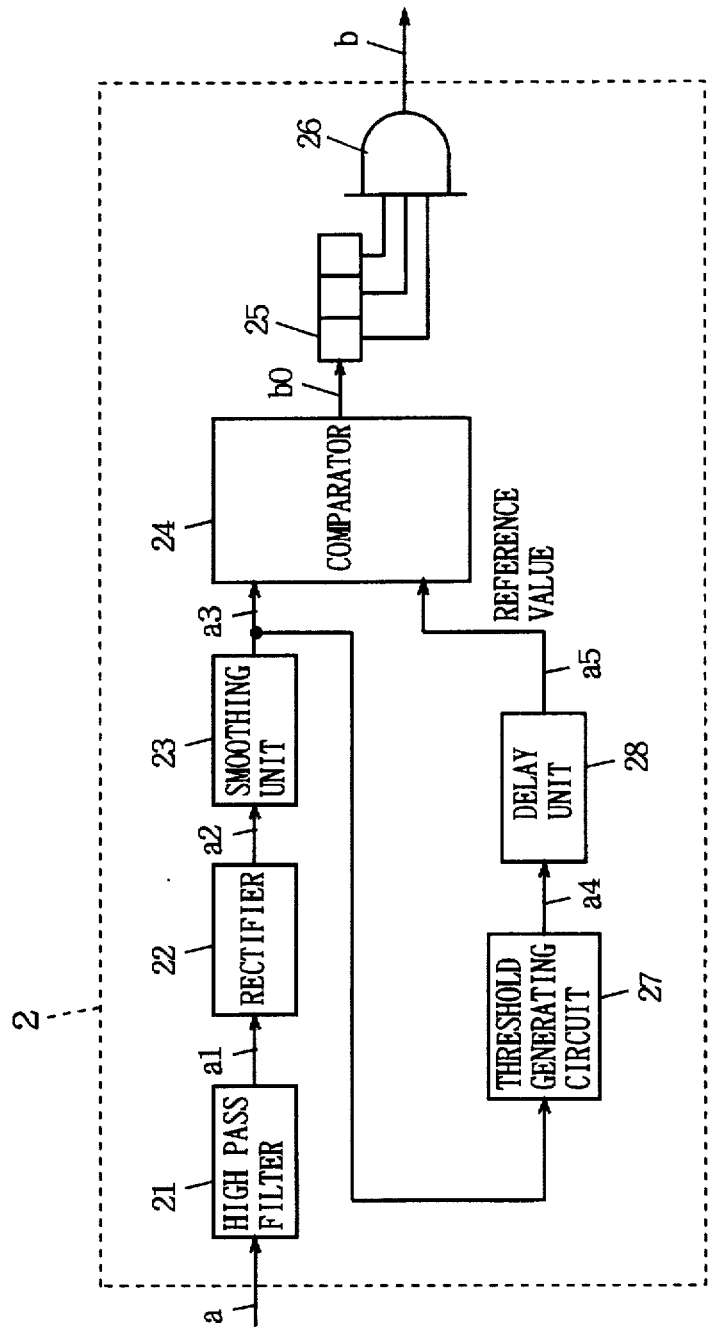
FIG. 18 is a block diagram showing a detailed structure of a level detector in the DC offset compensation device according to a fourth embodiment of the present invention.

The DC offset device according to a fourth embodiment of the present invention is different from the structure shown in FIG. 1 in that the level detector 2 has the structure shown in FIG. 18 instead of the structure shown in FIG. 2. Therefore, the illustration of the DC offset compensation device according to the fourth embodiment is omitted. Further, since the structure other than the above described difference from that of FIG. 1 is the same as the structure for which the same reference numbers are provided in FIG. 1, the description is omitted.

The comparator 24 shown in FIG. 2 compares the smooth output a3 with the reference value having a fixed value. Therefore, the level detector 2 shown in FIG. 2 cannot normally generate the level signal b until the smooth output a3 at the head portion of the burst-like input signal a becomes a sufficiently large value, compared with a state that the gain of the AGC amplifier converges. Specifically, at the time of no signal when the gain of the AGC amplifier is the maximum, i.e., when the smooth output a3 caused only by noise is very small compared with the smooth output a3 after the gain of the AGC amplifier converges and when the burst-like input signal a has a small level such that, at the head portion of the input signal a, the smooth output a3 does not reach the fixed reference value, the level detector 2 shown in FIG. 2 cannot normally generate the level signal b even though an S/N ratio is sufficient, resulting in that the compensation of the DC offset component is not rapidly performed and the receiving performance is degraded. Therefore, the level detector 2 shown in FIG. 18 includes a threshold generating circuit 27 and a delay unit 28.

FIG. 18 is a block diagram showing a structure of the level detector 2 of the DC offset compensation device according to the embodiment. In FIG. 18, the level detector 2 is different from the structure shown in FIG. 2 in that the threshold generating circuit 27 and the delay unit 28 are included and that the delayed threshold a5 (refer to FIG. 20(d)) is inputted as a reference value by the comparator 24. Since the other structure is the same as the structure for which the same reference numbers are provided in FIG. 2, the description is omitted.

Figure 19:
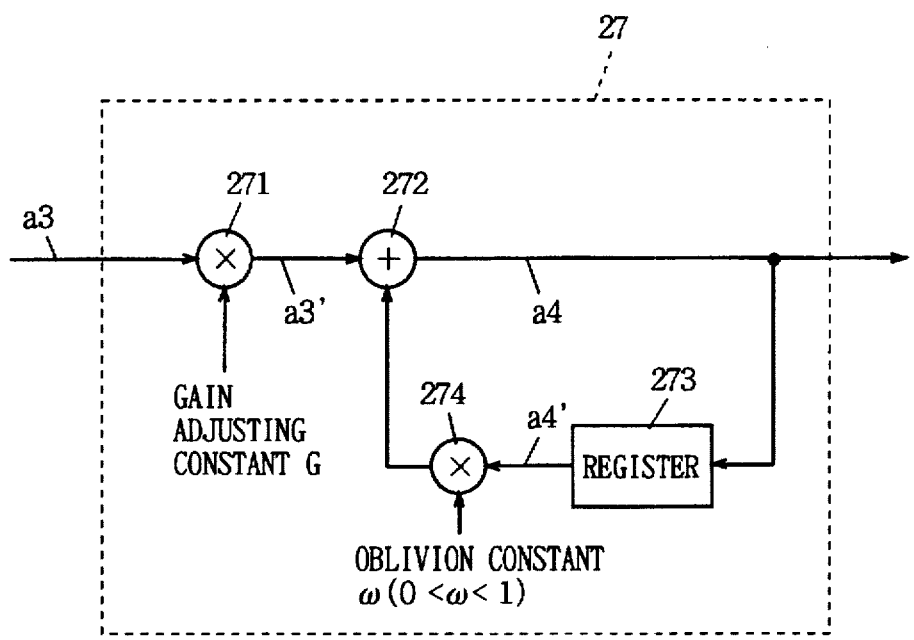
FIG. 19 is a block diagram showing an example of a structure of a threshold generating circuit 27 shown in FIG. 18.

The threshold generating circuit 27 further decreases time variation of the inputted smooth output a3 to generate a threshold a4, and is typically realized by a low pass filter or an integrator. FIG. 19 is a block diagram showing an example of the structure of the threshold generating circuit 27 shown in FIG. 18. In FIG. 19, the threshold generating circuit 27 has a gain adjusting constant multiplier 271, an adder 272, a register 273 and an oblivion constant multiplier 274. The gain adjusting constant multiplier 271 multiplies the inputted smooth output a3 by a predetermined gain adjusting constant G to output a gain adjusting multiplier output a3'. The register 273 holds a threshold a4 outputted from the adder 272 at the immediately preceding sampling time to output a register output a4'. The oblivion constant multiplier 274 multiplies an oblivion constant $\omega$ ($0<\omega<1$) which is a predetermined constant by the register output a4' outputted from the register 273. The adder 272 adds the gain adjusting multiplier output a3' outputted from the gain adjusting multiplier 274 to the register output a4' multiplied by the oblivion constant $\omega$ to obtain a new threshold a4. The gain with respect to the DC components of the threshold generating circuit 27 described above (=$G/(1-\omega)$) is set to not less than 1 (preferably about 1.5 to 3 times). That is, the threshold a4 is obtained by multiplying the time-average of the latest components of the smooth output a3 by the gain with respect to the DC components. The effective average time of the threshold generating circuit 27. i.e., the time constant, is preferably several to tens of times of the symbol time of the input signal a (refer to FIG. 20(a)).

When the threshold a4 generated as described above is inputted as it is to the comparator 24 as a reference value, the reference value itself varies at the time of level variation at the head portion of the input signal a. The reference value thus increases during the time of storing the judgement output b0 (hereinafter referred to as a judging time) at the shift register 25. Therefore, the comparator 24 fails to detect the level variation. The reference value should be generated on the basis of the time average value of the smooth output a3 only by noise from inputting time of the input signal a at least until the judging time. Therefore, the delay unit 28 is set in the rear of the threshold generating circuit 27. The delay unit 28 delays the inputted threshold a4 for at least the judging time and outputs a delayed threshold a5 to the comparator 24.

Therefore, the waveforms in the main portions of the level detector 2 shown in FIG. 18 are shown in FIGS. 20(a) to 20(d). FIG. 20(a) shows an input signal a to be inputted to the DC offset compensation device according to the fourth embodiment. In FIG. 20(a), the input signal a has a sufficient S/N ratio as described above, but is a burst-like signal, at whose head portion the smooth output a3 has a small level. FIG. 20(b) shows the smooth output a3 generated on the basis of the input signal a shown in FIG. 20(a). In FIG. 20(b), since the smooth output a3 is generated as described in the first embodiment, the description is omitted. FIG. 20(c) shows a threshold a4 generated on the basis of the smooth output a3 shown in FIG. 20(b). In FIG. 20(c), as described above, the threshold a4 is obtained by further reducing the time varying of the smooth output a3, and is multiplied by the above described gain (=G/(1−ω)). FIG. 20(d) shows the smooth output a3 inputted to the comparator 24 shown in FIG. 18 and the delayed threshold a5. In FIG. 20(d), the delayed threshold a5 is obtained by delaying the threshold a4 for at least the judging time. Therefore, since the comparator 24 compares the smooth output a3 generated according to input of the input signal a with the delayed threshold a5 generated only on the basis of noise at the head portion of the burst-like input signal a, the level varying of the head portion of the input signal a can be precisely detected to generate the level signal b.

As described above, the level detector 2 shown in FIG. 18 can generate the level signal b by precisely detecting the level varying at the head portion of the burst-like input signal a, compared with the level detector 2 shown in FIG. 2. In the level detector 2 in FIG. 18, however, since the reference value itself varies by variation of noise and the input signal a compared with the level detector 2 shown in FIG. 2, the detection accuracy of the head portion of the burst-like signal increases, while there is a fear of generating an erroneous level signal b at the other portions.

In FIG. 18, when the shift register 25 and the AND circuit 26 are omitted, i.e., the judging time is 0, the delay unit 28 can be omitted and the threshold a4 is directly taken as a reference value of the comparator 24. Further, the structure of level detector 2 can be applied to not only the level detector 2 in FIG. 1 but also the level detector in FIG. 16.

In each of the first to fourth embodiments described above, the input signal a may be an analog signal, and may also be a digital signal obtained by A/D converting an analog signal. Further, while the input signal a has been described assuming that it is an output of the AGC amplifier, it may be a detecting signal detecting an output of the AGC amplifier.

For example, base band signals I, Q generated by quadrature demodulation shown in FIG. 10 of Japanese Patent Laying-Open No. 8-032383 may be used as the input signal a. When the base band signal obtained by such detector is an object, if an oscillation signal of a local oscillator is leaked to be mixed into the input of the AGC amplifier to cause interference, or if an interference signal having the same frequency as that of a desired signal is simultaneously received to cause interference, the interference appears in the base band signal as the DC offset components. Therefore, in these cases, the DC offset compensation device also has the effect of reducing interference of an undesired signal.

While the invention has been described in detail, the foregoing description is in all aspects illustrative and not restrictive. It is understood that numerous other modifications and variations can be devised without departing from the scope of the invention.

What is claimed is:

1. A DC offset compensation device for compensating DC offset included in an input signal, said device comprising:

level detecting means for detecting variation in amplitude of the input signal to generate and output a level signal which defines a head portion of the input signal;

time constant controlling means for generating and for outputting a time constant control signal based on the level signal;

compensating means for subtracting an estimate of the DC offset from a value of the input signal to output a compensation output; and estimating means for receiving the compensation output, for estimating the DC offset of the input signal based on the compensation output with a time constant which varies according to the time constant control signal, and for outputting the estimate to feedback to said compensating means.

2. The DC offset compensation device according to claim 1, wherein the level signal is a binary signal having a first value or a second value;

a first time is a time when the level signal varies from the first value to the second value, and a second time is a time lapsed for a prescribed time from the first time in a state that the level signal has the second value, and said time constant controlling means is for outputting the time constant control signal for maximizing the time constant during a period when the level signal maintains the second value after the second time.

3. The DC offset compensation device according to claim 2, wherein said time constant controlling means is for generating and outputting the time constant control signal for minimizing the time constant during a period between the first time and the second time.

4. The DC offset compensation device according to claim 2, wherein said time constant controlling means is for generating and outputting the time constant control signal for monotonically increasing the time constant from a minimum to a maximum, continuously or stepwise.

5. The DC offset compensation device according to claim 1, wherein said estimating means comprises:

a first integrator for integrating the compensation output to output a first integration value;

a comparator for deciding an upper limit reference value and a lower limit reference value based on the time constant control signal and comparing the first integration value with the decided upper limit reference value and lower limit reference value to output a comparison output; and a second integrator for integrating the comparison output to output the estimate;

wherein said comparator outputs the comparison output as 0 when the first integration value is more than the lower limit reference value and less than the upper limit reference value, as +1 when the first integration value is not less than the upper limit reference value, and as −1 when the first integration value is not more than the lower limit reference value; and said first integrator resets the first integration value when the comparison output is +1 or −1.

6. The DC offset compensation device according to claim 5, wherein said first integrator comprises:

a quantizer for quantizing the compensation output according to the compensation output's amplitude and for generating and outputting a quantization signal;

a register for holding the first integration value; and an adder for adding the quantization signal to the first integration value held by said register and taking an addition result as the first integration value.

7. The DC offset compensation device according to claim 5, wherein said first integrator comprises:

a quantizer for quantizing the compensation output according to the compensation output's amplitude and for generating and outputting a quantization signal; and an up/down counter generating and outputting the first integration value based on the quantization signal;

wherein said up/down counter changes a counting direction based on the quantization signal.

8. The DC offset compensation device according to claim 6, wherein said quantizer is for quantizing to two values of {+1, −1} or three values {+1, 0, −1} according to the amplitude of the compensation output to output the quantization signal.

9. The DC offset compensation device according to claim 5, wherein said second integrator comprises:

a register for holding the estimate; and an adder for adding the comparison output to the estimation held by said register and for taking an addition result as the estimate.

10. The DC offset compensation device according to claim 5, wherein said second integrator comprises an up/down counter for generating and outputting the estimate based on the comparison output, and said up/down counter changes a counting direction based on the inputted comparison output.

11. The DC offset compensation device according to claim 1, wherein said estimating means comprises:

a correction constant generator for generating a correction constant according to the time constant control signal, an adder/subtractor for selecting addition or subtraction according to the compensation output, and a register for holding the estimate; wherein said adder/subtractor adds the estimate held by said register to the correction constant to output an addition result as an estimate when the compensation output is positive, and subtracts the correction constant from the estimate held by said register to output a subtraction result as an estimate when the compensation output is negative.

12. The DC offset compensation device according to claim 1, wherein said estimating means comprises:

a correction constant generator for generating a positive correction constant and a negative correction constant according to the time constant control signal to output either one of the correction constants according to the compensation output, a register for holding the estimate, and an adder for adding the correction constant outputted from said correction constant generator to the estimate held by said register to output an addition result as the estimate;

wherein said correction constant generator outputs the positive correction constant when the compensation output is positive, and the negative correction constant when the compensation output is negative.

13. A DC offset compensation device for compensating DC offset included in an input signal, said device comprising:

level detecting means for detecting variation in amplitude of the input signal to generate and output a level signal which defines a head portion of the input signal;

time constant controlling means for generating and for outputting a time constant control signal based on the level signal;

compensating means for subtracting an estimate of the DC offset from a value of the input signal to output a compensation output; and estimating means for receiving the input signal, for estimating the DC offset of the input signal with a time constant which varies according to the time constant control signal, and for outputting the estimate to feed forward to said compensating means.

14. The DC offset compensation device according to claim 13, wherein said estimating means is a low-pass filter for changing a tap coefficient according to the time constant control signal.

15. The DC offset compensation device according to claim 1, wherein said level detecting means comprises:

a high pass filter generating and outputting a high pass signal from which a low frequency component of the input signal is eliminated, a rectifier for generating and outputting a rectification signal obtained by rectifying the high pass signal, and a smoothing unit for generating and outputting a smooth output with a time variation of the rectification signal reduced; and said level detecting means is for outputting the level signal based on the smooth output.

16. The DC offset compensation device according to claim 15, wherein the level signal is a binary signal having a first value or a second value; and said level detecting means is for comparing the smooth output and a prescribed reference value and outputs the level signal as the second value when the smooth output is continuously greater than the prescribed reference value for a prescribed judging time and outputs the level signal as the first value otherwise.

17. A DC offset compensation device for compensating DC offset included in an input signal, said device comprising:

compensating means for subtracting an estimate of the DC offset from a value of the input signal to output a compensation output;

level detecting means for detecting variation in amplitude of the compensation output to generate and output a level signal which defines a head portion of the input signal;

time constant controlling means for generating and outputting a time constant control signal based on the level signal; and estimating means for receiving the compensation output, for estimating the DC offset of the input signal based on the compensation output with a time constant which varies according to the time constant control signal, and for outputting the estimate to feedback to said compensating means.

18. The DC offset compensation device according to claim 17, wherein said level detecting means comprises:

a rectifier for generating and outputting a rectification output obtained by rectifying said compensation output, and a smoothing unit for generating and outputting a smooth output with a time variation of the rectification output reduced; and said level detecting means is for outputting the level signal based on the smooth output.

19. The DC offset compensation device according to claim 18, wherein the level signal is a binary signal having a first value or a second value; and said level detecting means is for comparing the smooth output and a prescribed reference value and outputs the level signal as the second value when the smooth output is continuously greater than the prescribed reference value for a prescribed judging time and outputs the level signal as the first value otherwise.

20. The DC offset compensation device according to claim 1, wherein said level detecting means comprises:

a high pass filter for generating and outputting a high pass signal from which a low frequency component of the input signal is eliminated, a rectifier for generating and outputting a rectification output obtained by rectifying the high pass signal, a smoothing unit for generating and outputting a smooth output with a time variation of the rectification output reduced, a threshold generating means for time-average the smooth output and for generating and outputting a threshold formed by multiplying the time-averaged smooth output by a prescribed coefficient not less than 1, and a judging means for comparing the smooth output inputted by said smoothing unit with the threshold and generating and outputting a judgment output representing whether the smooth output is greater or less than the threshold; and said level detecting means is for outputting the level signal based on the judgment output.

21. The DC offset compensation device according to claim 20, wherein the level signal is a binary signal having a first value or a second value; and said level detecting means is for outputting the level signal as the second value when the judgment output continuously becomes a large value for a prescribed judging time and is for outputting the level signal as the first value otherwise.

22. The DC offset compensation device according to claim 1, wherein the level signal is a binary signal having a first value or a second value;

said level detecting means comprises:

a high pass filter for generating and outputting a high pass signal from which a low frequency component of the input signal is eliminated, a rectifier for generating and outputting a rectification output obtained by rectifying the high pass signal, a smoothing unit for generating and outputting a smooth output with a time variation of the rectification output reduced, a threshold generating means for time-average the smooth output and for generating and outputting a threshold formed by multiplying the time-averaged smooth output by a prescribed coefficient not less than 1, a delay means for generating and outputting a delayed threshold obtained by delaying the threshold for not less than a prescribed judging time, and a judging means for comparing the smooth output with the delayed threshold and generating and outputting a judgment output representing whether the smooth output is greater or less than the threshold; and said level detecting means is for outputting the level signal as the second value when the judgment output continuously becomes a large value for the prescribed judging time and is for outputting the level signal as the first value otherwise.

* * * * *